United States Patent
Anthony

(10) Patent No.: US 6,650,525 B2
(45) Date of Patent: *Nov. 18, 2003

(54) COMPONENT CARRIER

(75) Inventor: Anthony A. Anthony, Erie, PA (US)

(73) Assignee: X2Y Attenuators, LLC, Santa Monica, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/945,329

(22) Filed: Aug. 31, 2001

(65) Prior Publication Data

US 2002/0075096 A1 Jun. 20, 2002

Related U.S. Application Data

(63) Continuation of application No. 09/697,484, filed on Oct. 26, 2000, now abandoned, which is a continuation of application No. 09/056,436, filed on Apr. 7, 1998, now abandoned, and a continuation of application No. 09/056,379, filed on Apr. 7, 1998, now Pat. No. 6,018,448, which is a continuation-in-part of application No. 09/008,769, filed on Jan. 19, 1998, now Pat. No. 6,097,581, which is a continuation-in-part of application No. 08/841,940, filed on Apr. 8, 1997, now Pat. No. 5,909,350.

(51) Int. Cl.$^7$ .................................. H02H 9/00
(52) U.S. Cl. ..................... 361/111; 361/56; 361/58; 361/118; 361/119
(58) Field of Search .................. 361/56, 58, 111, 361/113, 117, 118, 119, 127

(56) References Cited

U.S. PATENT DOCUMENTS

| 3,790,858 A | 2/1974 | Brancaleone et al. |
| 3,842,374 A | 10/1974 | Schlicke |
| 4,139,783 A | 2/1979 | Engeler |

(List continued on next page.)

FOREIGN PATENT DOCUMENTS

| DE | 198 57 043 C1 | 3/2000 |
| JP | 3-18112 | 1/1991 |
| JP | 6-53048 | 2/1994 |

(List continued on next page.)

OTHER PUBLICATIONS

PCT International Search Report for International Application No. PCT/US98/06962 Aug. 19, 1998.
PCT International Search Report for International Application No. PCT/US99/01040 Apr. 19, 1999.
PCT International Search Report for International Application No. PCT/US99/07653 Jul. 19, 1999.

(List continued on next page.)

Primary Examiner—Stephen W. Jackson
(74) Attorney, Agent, or Firm—Hahn Loeser & Parks, LLP; Robert J. Clark

(57) ABSTRACT

The present invention is a surface mount component carrier comprised of a disk of insulating material having at least two apertures. The disk is substantially covered by a metalized ground surface and includes at least two conductive pads surrounding the apertures, and insulating bands which surround each conductive pad. The insulating bands separate and electrically isolates the conductive pads from the metalized ground surface. A surface mount component, such as a differential and common mode filter, is positioned lengthwise between the two conductive pads and operably coupled to the carrier. Once the surface mount component is coupled to the carrier, the combination can be manipulated, either manually or through various types of automated equipment, without subjecting the surface mount component to mechanical and physical stresses normally associated with the handling of miniature components. The carrier also provides the added benefit of improved shielding from electromagnetic interference and over voltage dissipation due to the surface area of the metalized ground surface. The same concept for the above described carrier is also incorporated into several alternate embodiments, either independently or embedded within electronic connectors.

36 Claims, 12 Drawing Sheets

U.S. PATENT DOCUMENTS

| | | |
|---|---|---|
| 4,262,317 A | 4/1981 | Baumbach |
| 4,335,417 A | 6/1982 | Sakshaug et al. |
| 4,587,589 A | 5/1986 | Marek |
| 4,682,129 A | 7/1987 | Bakermans et al. |
| 4,688,151 A | 8/1987 | Kraus et al. |
| 4,772,225 A | 9/1988 | Ulery |
| 4,789,847 A | 12/1988 | Sakamoto et al. |
| 4,814,295 A | 3/1989 | Mehta |
| 4,967,315 A | 10/1990 | Schelhorn |
| 5,059,140 A | 10/1991 | Philippson et al. |
| 5,065,284 A | 11/1991 | Hernandez |
| 5,079,069 A | 1/1992 | Howard et al. |
| 5,140,497 A | 8/1992 | Kato et al. |
| 5,142,430 A | 8/1992 | Anthony |
| 5,155,655 A | 10/1992 | Howard et al. |
| 5,161,086 A | 11/1992 | Howard et al. |
| 5,181,859 A | 1/1993 | Foreman et al. |
| 5,186,647 A | 2/1993 | Denkmann et al. |
| 5,236,376 A | 8/1993 | Cohen |
| 5,243,308 A | 9/1993 | Shusterman et al. |
| 5,251,092 A | 10/1993 | Brady et al. |
| 5,261,153 A | 11/1993 | Lucas |
| 5,268,810 A | 12/1993 | DiMarco et al. |
| 5,290,191 A | 3/1994 | Foreman et al. |
| 5,299,956 A | 4/1994 | Brownell et al. |
| 5,310,363 A | 5/1994 | Brownell et al. |
| 5,311,408 A | 5/1994 | Ferchau et al. |
| 5,321,373 A | 6/1994 | Shusterman et al. |
| 5,321,573 A | 6/1994 | Person et al. |
| 5,326,284 A | 7/1994 | Bohbot et al. |
| 5,337,028 A | 8/1994 | White |
| 5,353,189 A | 10/1994 | Tomlinson |
| 5,353,202 A | 10/1994 | Ansell et al. |
| 5,362,249 A | 11/1994 | Carter |
| 5,362,254 A | 11/1994 | Siemon et al. |
| 5,396,201 A | 3/1995 | Ishizaki et al. |
| 5,414,393 A | 5/1995 | Rose et al. |
| 5,414,587 A | 5/1995 | Kiser et al. |
| 5,432,484 A | 7/1995 | Klas et al. |
| 5,446,625 A | 8/1995 | Urbish et al. |
| RE35,064 E | 10/1995 | Hernandez |
| 5,455,734 A | 10/1995 | Foreman et al. |
| 5,477,933 A | 12/1995 | Nguyen |
| 5,483,407 A | 1/1996 | Anastasio et al. |
| 5,488,540 A | 1/1996 | Hatta |
| 5,500,629 A | 3/1996 | Meyer |
| 5,500,785 A | 3/1996 | Funada |
| 5,512,196 A | 4/1996 | Mantese et al. |
| 5,535,101 A | 7/1996 | Miles et al. |
| 5,555,150 A | 9/1996 | Newman, Jr. |
| 5,568,348 A | 10/1996 | Foreman et al. |
| 5,586,007 A | 12/1996 | Funada |
| 5,592,391 A | 1/1997 | Muyshondt et al. |
| 5,640,048 A | 6/1997 | Selna |
| 5,700,167 A | 12/1997 | Pharney et al. |
| 5,751,539 A | 5/1998 | Stevenson et al. |
| 5,767,446 A | 6/1998 | Ha et al. |
| 5,797,770 A | 8/1998 | Davis et al. |
| 5,808,873 A | 9/1998 | Celaya et al. |
| 5,825,628 A | 10/1998 | Garbelli et al. |
| 5,828,093 A | 10/1998 | Naito et al. |
| 5,838,216 A | 11/1998 | White et al. |
| 5,880,925 A | 3/1999 | DuPre et al. |
| 5,889,445 A | 3/1999 | Ritter et al. |
| 5,909,350 A * | 6/1999 | Anthony ..................... 333/182 |
| 5,959,829 A | 9/1999 | Stevenson et al. |
| 6,018,448 A | 1/2000 | Anthony |
| 6,034,864 A | 3/2000 | Naito et al. |
| 6,038,121 A | 3/2000 | Naito et al. |
| 6,072,687 A | 6/2000 | Naito et al. |
| 6,097,581 A | 8/2000 | Anthony |
| 6,331,926 B1 | 12/2001 | Anthony |

FOREIGN PATENT DOCUMENTS

| | | |
|---|---|---|
| JP | 6-53049 | 2/1994 |
| JP | 6-53075 | 2/1994 |
| JP | 6-53077 | 2/1994 |
| JP | 6-53078 | 2/1994 |
| JP | 6-84695 | 3/1994 |
| JP | 6-151014 | 5/1994 |
| JP | 6-151244 | 5/1994 |
| JP | 6-151245 | 5/1994 |
| JP | 6-325977 | 11/1994 |
| JP | 7-235406 | 9/1995 |
| JP | 7-235852 | 9/1995 |
| JP | 8-124795 | 5/1996 |
| JP | 8-172025 | 7/1996 |
| JP | 7-240651 | 9/1996 |
| JP | 11-214256 | 8/1999 |
| WO | WO 00/16446 | 3/2000 |

OTHER PUBLICATIONS

PCT International Search Report for International Application No. PCT/US00/11409 Sep. 18, 2000.

PCT International Search Report for International Application No. PCT/US00/14626 Sep. 13, 2000.

PCT International Search Report for International Application No. PCT/US00/16518 Nov. 8, 2000.

PCT International Search Report for International Application No. PCT/US00/21178 Dec. 28, 2000.

* cited by examiner

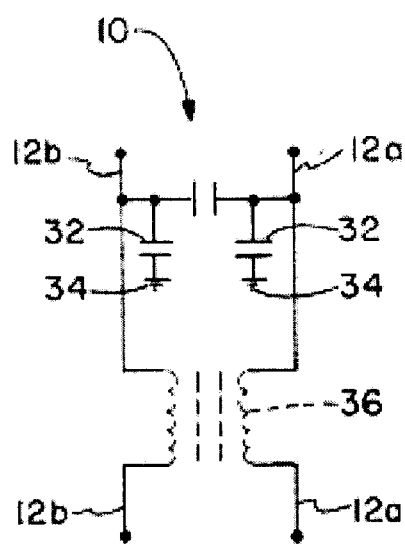
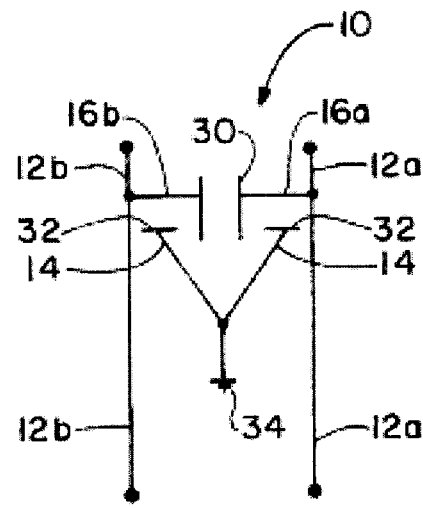
FIG.-2A
FIG.-2B
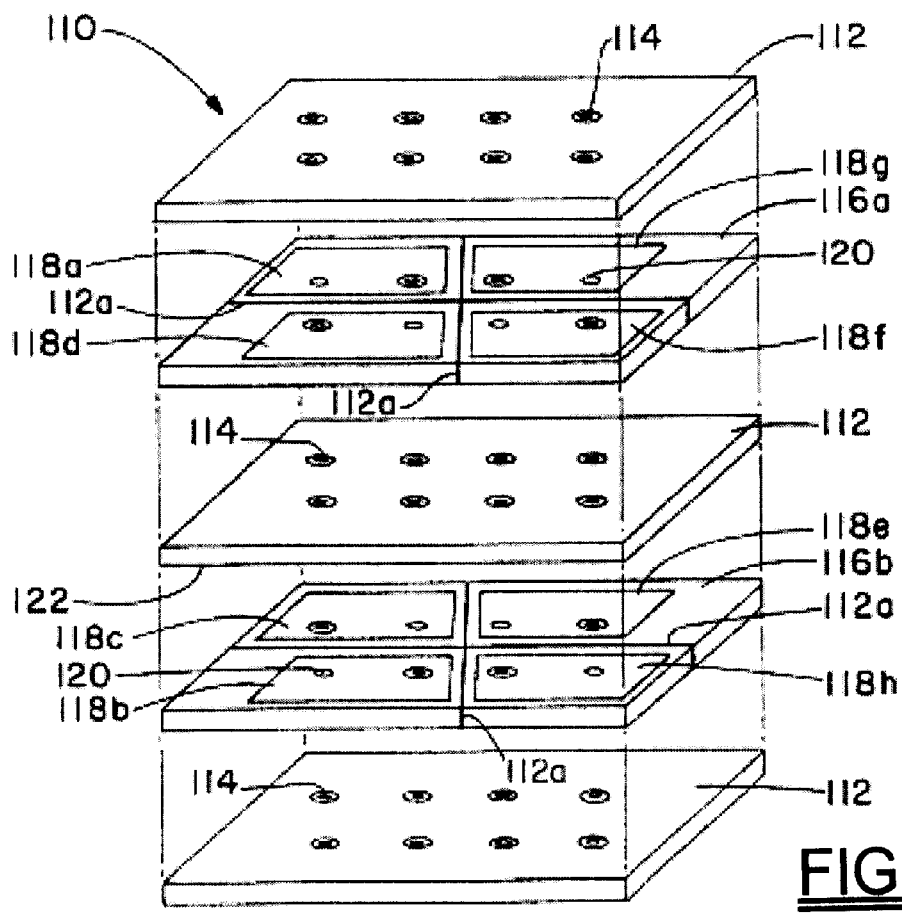
FIG. 3

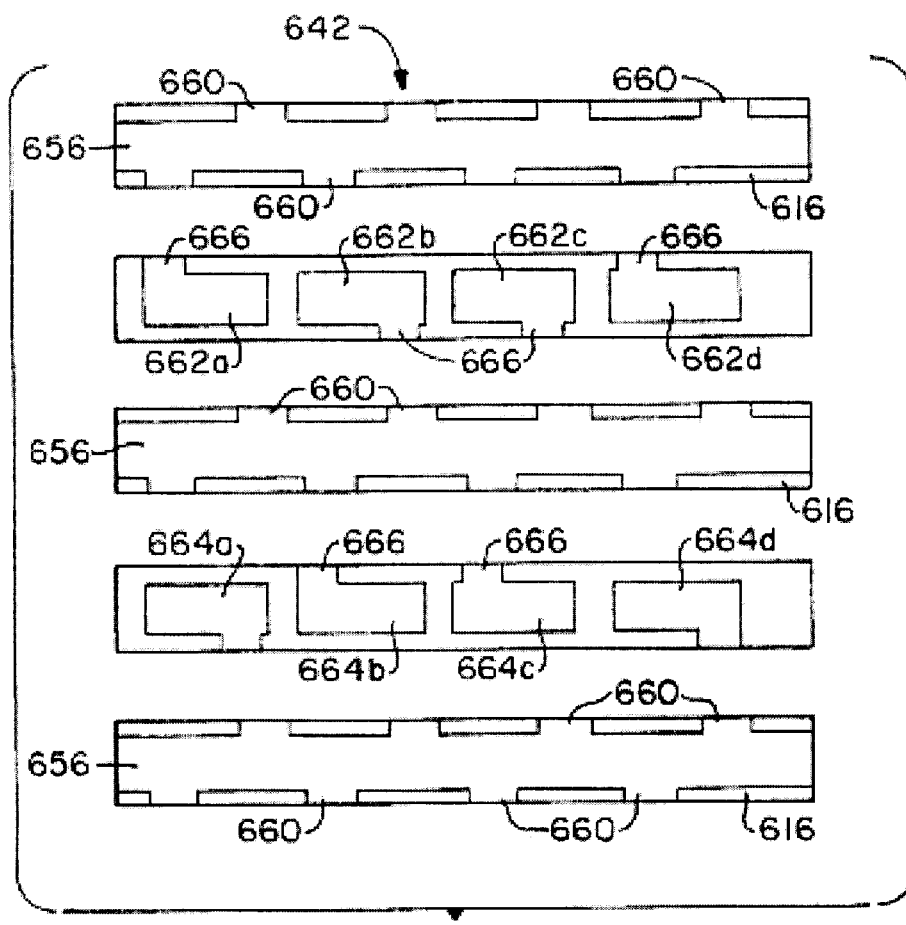
FIG. 10
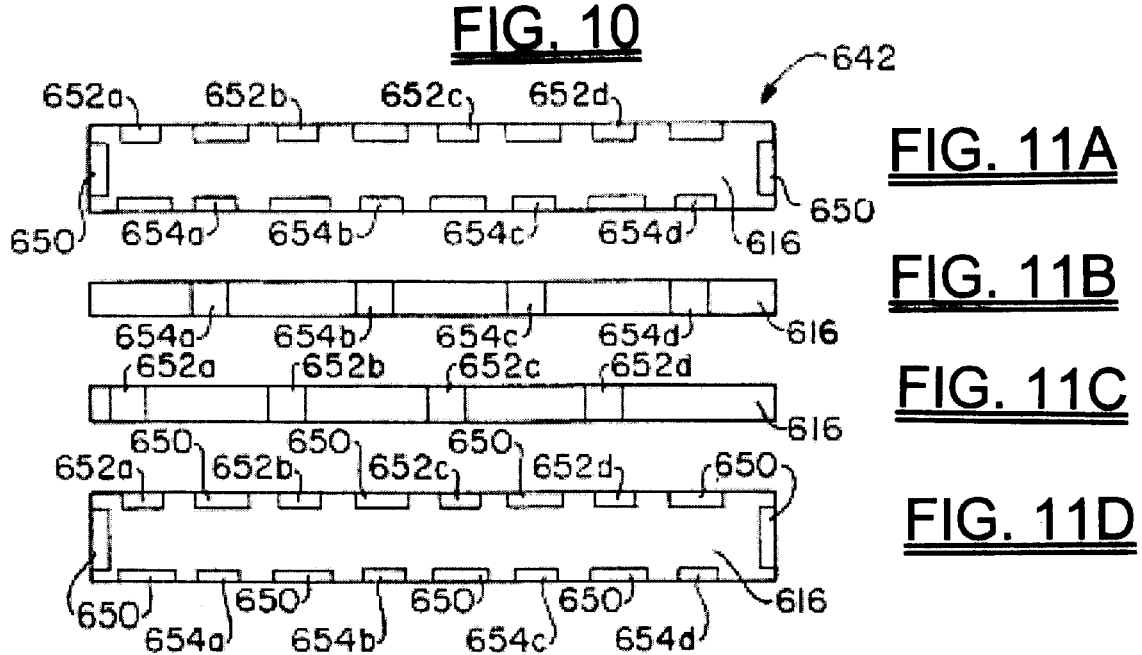
FIG. 11A
FIG. 11B
FIG. 11C
FIG. 11D

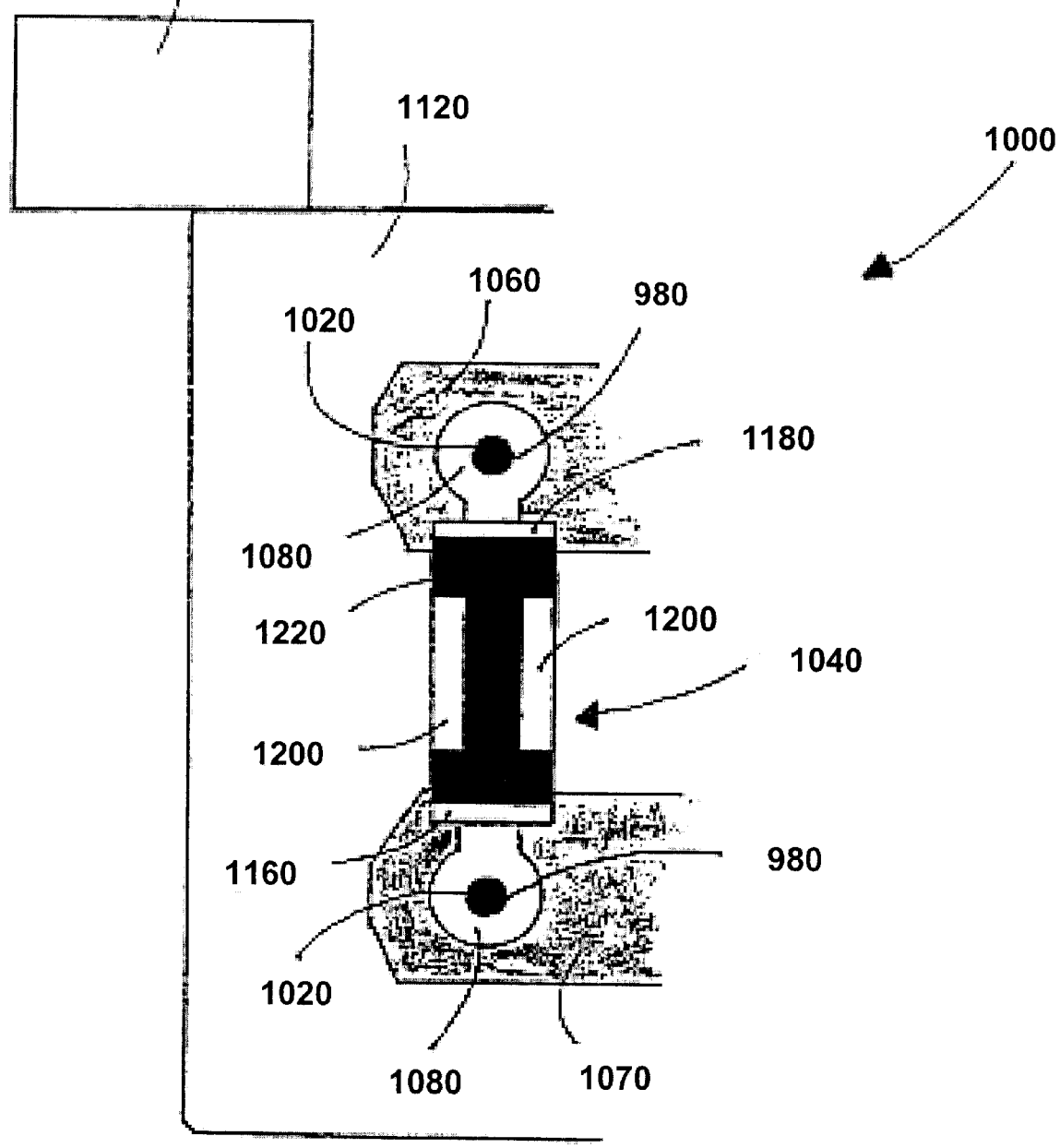

COMPONENT CARRIER

This application is a continuation of application Ser. No. 09/697,484 filed Oct. 26, 2000 now abandonded, which is a continuation of both application Ser. No. 09/056,436 filed Apr. 7, 1998, now abandoned, and application Ser. No. 09/056,379 filed Apr. 7, 1998, now U.S. Pat. No. 6,018,448, which is a continuation-in-part of application Ser. No. 09/008,769 filed Jan. 19, 1998, now U.S. Pat. No. 6,097,581, which is a continuation-in-part of application Ser. No. 08/841,940 filed Apr. 8, 1997, now U.S. Pat. No. 5,909,350.

TECHNICAL FIELD

The present invention relates to a filter for protecting electronic circuitry from electromagnetic field interference (EMI), over voltages and preventing electromagnetic emissions. More specifically, this invention relates to a multi-functional electronic component whose physical architecture suppresses unwanted electromagnetic emissions, both those received from other sources and those created internally within electronic circuitry by differential and common mode currents. In addition, due to the electronic component's physical architecture and material composition, over voltage surge protection and magnetic properties can be integrally incorporated with the differential and common mode filtering and the invention relates to component carrier substrates used to protect electronic components from mechanical stresses associated with their handling and coupling within electronic equipment. The component carrier substrates also provide electrical interference shielding and improved thermal characteristics.

BACKGROUND OF THE INVENTION

The majority of electronic equipment produced presently, and in particular computers, communication systems, military surveillance equipment, stereo and home entertainment equipment, televisions and other appliances include miniaturized components to perform new high speed functions and electrical interconnections which according to the materials from which they are made or their mere size are very susceptible to stray electrical energy created by electromagnetic interference or voltage transients occurring on electrical lines. Voltage transients can severely damage or destroy such micro-electronic components or contacts thereby rendering the electronic equipment inoperative, and requiring extensive repair and/or replacement at great cost.

Electrical interference in the form of EMI or RFI can be induced into electrical lines from such sources as radio broadcast antennas or other electromagnetic wave generators. EMI can also be generated from the electrical circuit which is desired to be shielded from EMI. Differential and common mode currents are typically generated in cables and on circuit board tracks. In many cases fields radiate from these conductors which act as antennas. Controlling these conducted/radiated emissions is necessary to prevent interference with other circuitry or other parts of the circuit generating or sensitive to the unwanted noise. Other sources of interference are generated from equipment coupled to the electrical lines, such as computers, switching power supplies and a variety of other systems, which may generate significant interference which is desired to be eliminated to meet international emission and/or susceptibility requirements.

Transient voltages occurring on electrical lines can be induced by lightning which produces extremely large potentials in a very short time. In a similar manner, nuclear electromagnetic pulses (EMP) generate even larger voltage spikes with faster rise time pulses over a broad frequency range which is detrimental to most electronic devices. Other sources of large voltage transients are found to be associated with voltage surges occurring upon the switching off or on of some electronic power equipment as well as ground loop interference caused by varying ground potentials. Existing protection devices, primarily due to their architecture and basic materials, do not provide adequate protection in a single integrated package.

Based upon the known phenomenon of electromagnetic emissions and transient voltage surges a variety of filter and surge suppression circuit configurations have been designed as is evident from the prior art. A detailed description of the various inventions in the prior art is disclosed in co-owned U.S. Pat. No. 5,142,430, herein incorporated by reference.

The '430 patent itself is directed to power line filter and surge protection circuit components and the circuits in which they are used to form a protective device for electrical equipment. The circuit components comprise wafers or disks of material having desired electrical properties such as varistor or capacitor characteristics. The disks are provided with electrode patterns and insulating bands on surfaces thereof which co-act with apertures formed therein so as to electrically connect the components to electrical conductors of a system easily and effectively. These electrode patterns act in conjunction with one another to form common electrodes with the material interposed there between. The '430 patent was primarily directed toward filtering paired lines. The present invention improves on the paired line concept by refining and adapting the concept for use with low voltage low current data communication lines as well as arrangements directed towards high voltage industrial and home applications such as three phase power lines, electric motor noise filtering, LANs and other computer and electronic devices.

Based upon the foregoing there was found a need to provide a multi-functioning electronic component architecture which attenuates electromagnetic emissions resulting from differential and common mode currents flowing within electronic circuits, single lines, pairs of lines and multiple twisted pairs. Such multi-functioning electronic components are the subject of application Ser. No. 09/008,769, now U.S. Pat. No. 6,097,581, which is a continuation-in-part of application Ser. No. 08/841,940, now U.S. Pat. No. 5,909,350, both of which are incorporated herein by reference.

While the above referenced electronic components accomplish their respective tasks, usage of such components has been limited for a number of reasons. First, the number of such components required continues to increase as applications, such as data buses, continue to grow. In addition, as the number of required components grows, so does the physical size of multi-component packages. Second, by their nature the electronic components referred to are delicate structures which do not handle physical stress well. During the manufacture of electronic products a number of mechanical stresses associated with handling and soldering can damage the components.

Another drawback to using the referenced electronic components is that it becomes very tedious to manually handle and mount the components on electronic products being assembled. This often time translates into lower product yields and added expense due to broken or misconnected components.

A further disadvantage to some of the components is that they include leads for thru-hole insertion. Physical stressing, bending or applying torque to the leads can cause a failure in the final product, either immediately or later thereby affecting the products overall reliability.

Therefore, in light of the foregoing deficiencies in the prior art, the applicant's invention is herein presented.

SUMMARY OF THE INVENTION

Based upon the foregoing and because of the sensitive nature of electronic technology there is also a need for combining electromagnetic filtering with surge protection to eliminate the susceptibility to over voltages and emissions from external sources. Due to the highly competitive nature of today's electronic industry such a differential and common mode filter/surge protector must be inexpensive, miniaturized, low in cost and highly integrated to be incorporated into a plurality of electronic products.

It is therefore a main object of the invention to provide an easily manufactured and adaptable multi-functional electronic component which filters electromagnetic emissions caused by differential and common mode currents.

It is another object of the invention to provide a protective circuit arrangement which may be mass produced and adaptable to include one or more protective circuits in one component package to provide protection against voltage transients, over voltages and electromagnetic interference.

Another object of the invention is to provide protective circuits having an inherent ground which provides a path for attenuating EMI and over voltages without having to couple the hybrid electronic component to circuit or earth ground.

Another object of the invention is to provide a component carrier which is less susceptible to mechanical stresses and shock, more easily assembled, surface mountable and capable of being used in automated assembly.

These and other objects and advantages of the invention are accomplished through the use of a plurality of common ground conductive plates surrounding corresponding electrode plates separated by a material which exhibits any one or a combination of a number of predetermined electrical properties. By coupling pairs of conductors to the plurality of common ground conductive plates and selectively coupling the conductors to electrode plates, line-to-line and line-to-ground component coupling is accomplished providing differential and common mode electromagnetic interference filtering and/or surge protection. The circuit arrangement comprises at least one line conditioning circuit component constructed as a plate. Electrode patterns are provided on one surface of the plate and the electrode surfaces are then electrically coupled to electrical conductors of the circuit. The electrode patterns, dielectric material employed and common ground conductive plates produce commonality between electrodes for the electrical conductors which produces a balanced (equal but opposite) circuit arrangement with an electrical component coupled line-to-line between the electrical conductors and line-to-ground from the individual electrical conductors.

The particular electrical effects of the differential and common mode filter are determined by the choice of material between the electrode plates and the use of ground shields which effectively house the electrode plates within one or more Faraday cages. If one specific dielectric material is chosen the resulting filter will be primarily a capacitive arrangement. The dielectric material in conjunction with the electrode plates and common ground conductive plates will combine to create a line-to-line capacitor and a line-to-ground capacitor from each individual electrical conductor. If a metal oxide varistor (MOV) material is used then the filter will be a capacitive filter with over current and surge protection characteristics provided by the MOV-type material. The common ground conductive plates and electrode plates will once again form line-to-line and line-to-ground capacitive plates providing differential and common mode filtering accept in the case of high transient voltage conditions. During these conditions the MOV-type varistor material, which is essentially a non-linear resistor used to suppress high voltage transients, will take effect to limit the voltage which may appear between the electrical conductors.

In a further embodiment a ferrite material may be used adding additional inherent inductance to the differential and common mode filter arrangement. As before, the common ground conductive and electrode plates form line-to-line and line-to-ground capacitive plates with the ferrite material adding inductance to the arrangement. Use of the ferrite material also provides transient voltage protection in that it to will become conductive at a certain voltage threshold allowing the excess transient voltage to be shunted to the common ground conductive plates, effectively limiting the voltage across the electrical conductors.

It is therefore another main object of the present invention to provide a component carrier for maintaining one or more surface mount components.

It is another object of the present invention to provide a component carrier which is less susceptible to mechanical stresses imparted upon components during various manufacturing processes.

It is also an object of the present invention to provide a component carrier having an enhanced ground surface which improves the functional characteristics of surface mount components coupled to the component carrier.

These and other objects and advantages of the present invention are accomplished through the use of a surface mount component carrier comprised of a disk of insulating material having at least two apertures. The disk is substantially covered by a metalized ground surface and includes at least two conductive pads surrounding the apertures, and insulating bands which surround each conductive pad. The insulating bands separate and electrically isolates the conductive pads from the metalized ground surface. A specific type of surface mount component, such as a differential and common mode filter, is positioned lengthwise between the two conductive pads and operably coupled to the carrier. Once the specific type of surface mount component is coupled to the carrier, the combination can be manipulated, either manually or through various types of automated equipment, without subjecting the surface mount component to mechanical and physical stresses normally associated with the handling of miniature components. The carrier also provides the added benefit of improved shielding from electromagnetic interference and over voltage dissipation due to the surface area of the metalized ground surface. The same concept for the above described carrier is also incorporated into several alternate embodiments, either independently or embedded within electronic connectors.

These numerous other arrangements and configurations along with other objects and advantages which implement and build on the present invention will become more readily apparent from a reading of the detailed description, the drawings and the claims taken in conjunction with the disclosed versatility and wide spread application of specific types of differential and common mode filters within the scope of the present invention.

BRIEF DESCRIPTION OF THE DRAWINGS

FIG. 2 provides schematic diagrams of the filter shown in FIG. 1 with FIG. 2A being a pure schematic representation and FIG. 2B being a schematic representation of the physical architecture;

FIG. 3 is an exploded perspective view of a multi-conductor differential and common mode filter for use in connector applications;

FIG. 7 shows a multi-filter surface mount component with FIG. 7a being a top plan view of the filter; FIG. 7e shows a front elevational view in cross section of the filter shown in FIG. 7a;

FIG. 9 shows a further alternate embodiment of the present invention; FIG. 9b is a front elevational view of the filter shown in FIG. 9a; FIG. 9c is an electrical representation of the physical embodiment of the filter shown in FIG. 9a; and FIG. 9d is an alternate electrical representation of the physical embodiment of the filter shown in FIG. 9a;

FIG. 10 is an exploded view of the individual internal layers which makeup a multi-component strip filter wherein each internal layer shown is a bottom plan view of the layer;

FIG. 11 shows the multi-component strip filter shown in FIG. 10, where FIG. 11A is a top plan view, FIG. 11B is front side elevational view, FIG. 11C is a back side elevational view and FIG. 11D is a bottom plan view;

FIG. 18 is a partial, top plan view of the connector surface mount component carrier shown in FIG. 17.

DETAILED DESCRIPTION OF THE PREFERRED EMBODIMENTS

Specific types of surface mount components such as differential and common mode filters as are disclosed in application Ser. No. 09/008,769, now U.S. Pat. No. 6,097,581, which is a continuation-in-part of application Ser. No. 08/841,940, now U.S. Pat. No. 5,909,350, both of which are incorporated herein by reference.

Due to the continued and increasing use of electronics in daily life and the amount of electromagnetic interference (EMI) and emissions generated, new world electromagnetic compatibility (EMC) requirements are being specified daily for use in such diverse applications as in the home, hospitals, automotive, aircraft and satellite industries. The present invention is directed towards a physical architecture for an electronic component which provides EMI suppression, broad band I/O-line filtering, EMI decoupling noise reduction and surge protection in one assembly.

To propagate electromagnetic energy two fields are required, an electric and magnetic. Electric fields couple energy into circuits through the voltage differential between two or more points. Magnetic fields couple energy into circuits through inductive coupling. Magnetic fields originate from currents flowing in a path which could simply consist of a loop of wire. In such loops both fields exist and are also included within circuit traces found on printed circuit boards. These fields start to diverge at frequencies above 1 MHz.

As previously noted, propagated electromagnetic energy is the cross product of both electric and magnetic fields. Typically, emphasis is placed on filtering EMI from circuit conductors carrying DC to high frequency noise. This can be explained for two reasons, the first being that a changing electric field in free space gives rise to a magnetic field and second because a time varying magnetic flux will give rise to an electric field. As a result a purely electric or magnetic time varying field cannot exist. Fields may be primarily electric or primarily magnetic but neither can be generated exclusively.

The main cause of radiated emission problems are due to the two types of conducted currents, differential and common mode. The fields generated by these currents result in EMI emissions. Differential mode (DM) currents are those currents which flow in a circular path in wires, circuit board traces and other conductors in a manner in which the field related to these currents originates from the loop defined by the conductors.

Common and differential mode currents differ in that they flow in different circuit paths. Common mode noise currents are surface phenomena relative to ground and, for example, travel on the outer skin of cables which are often grounded to the chassis. To reduce, minimize or suppress the noise it is necessary to provide a low impedance path to ground while simultaneously shortening the overall noise current loop.

Figure 1:
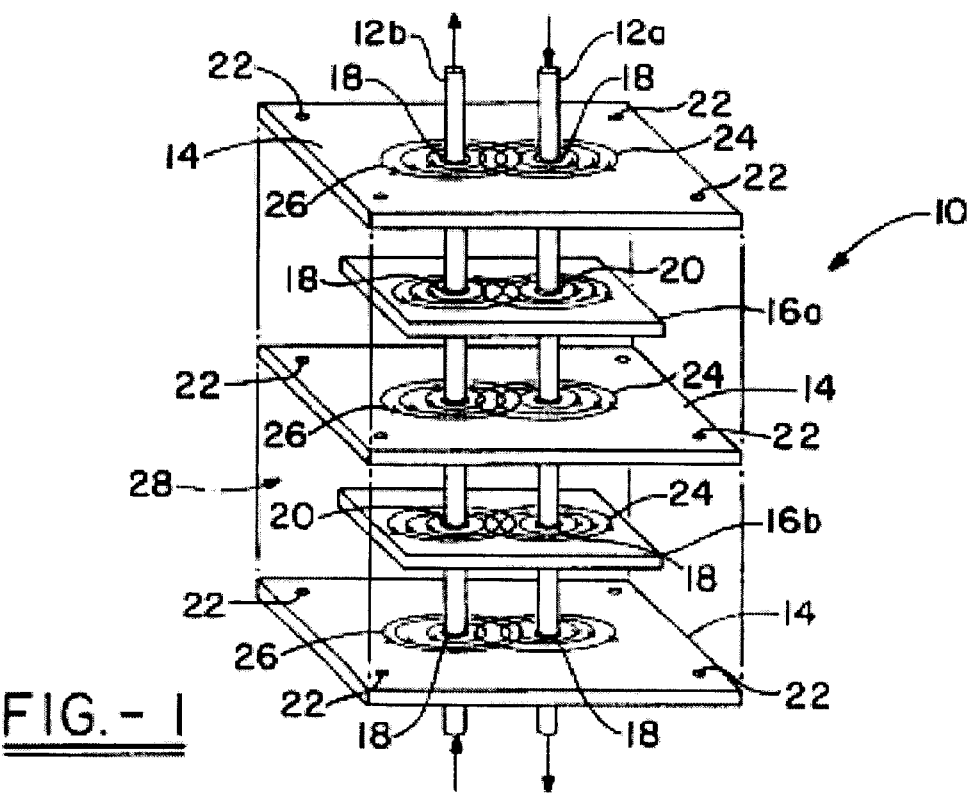
FIG. 1 shows an exploded perspective view of a differential and common mode filter in accordance with the present invention.

Turning now to FIG. 1, an exploded perspective view of differential and common mode filter 10's physical architecture is shown. Filter 10 is comprised of a plurality of common ground conductive plates 14 at least two electrode plates 16a and 16b where each electrode plate 16 is sandwiched between two common ground conductive plates 14. At least one pair of electrical conductors 12A and 12B is disposed through insulating apertures 18 or coupling apertures 20 of the plurality of common ground conductive plates 14 and electrode plates 16a and 16b with electrical conductors 12A and 12B also being selectively connected to coupling apertures 20 of electrode plates 16a and 16b. Common ground conductive plates 14 consist entirely of a conductive material such as metal in the preferred embodiment. At least one pair of insulating apertures 18 are disposed through each common ground conductive plate 14 to allow electrical conductors 12 to pass through while maintaining electrical isolation between common ground conductive plates 14 and electrical conductors 12. The plurality of common ground conductive plates 14 may optionally be equipped with fastening apertures 22 arranged in a predetermined and matching position to enable each of the plurality of common ground conductive plates 14 to be coupled securely to one another through standard fastening means such as screws and bolts. Fastening apertures 22 may also be used to secure differential and common mode filter 10 to another surface such as an enclosure or chassis of the electronic device filter 10 is being used in conjunction with.

Electrode plates 16a and 16b are similar to common ground conductive plates 14 in that they are comprised of a conductive material and have electrical conductors 12A and 12B disposed through apertures. Unlike common ground conductive plates 14, electrode plates 16a and 16bi are selectively electrically connected to one of the two electrical conductors 12. While electrode plates 16, as shown in FIG. 1, are depicted as smaller than common ground conductive plates 14 this is not required but in this configuration has been done to prevent electrode plates 16 from interfering with the physical coupling means of fastening apertures 22.

Electrical conductors 12 provide a current path which flows in the direction indicated by the arrows positioned at either end of the electrical conductors 12 as shown in FIG. 1. Electrical conductor 12A represents an electrical signal conveyance path and electrical conductor 12B represents the signal return path. While only one pair of electrical conductors 12A and 12B is shown, Applicant contemplates differential and common mode filter 10 being configured to provide filtering for a plurality of pairs of electrical conductors creating a high density multi-conductor differential and common mode filter.

The final element which makes up differential and common mode filter 10 is material 28 which has one or a number of electrical properties and surrounds the center common ground conductive plate 14, both electrode plates 16a and 16b and the portions of electrical conductors 12A and 12B passing between the two outer common ground conductive plates 14 in a manner which completely isolates all of the plates and conductors from one another except for the connection created by the conductors 12A and 12B and coupling aperture 20.

The electrical characteristics of differential and common mode filter 10 are determined by the selection of material 28. If a dielectric material is chosen filter 10 will have primarily capacitive characteristics. Material 28 may also be a metal oxide varistor material which will provide capacitive and surge protection characteristics. Other materials such as ferrites and sintered polycrystalline may be used wherein ferrite materials provide an inherent inductance along with surge protection characteristics in addition to the improved common mode noise cancellation that results from the mutual coupling cancellation effect. The sintered polycrystalline material provides conductive, dielectric, and magnetic properties. Sintered polycrystalline is described in detail in U.S. Pat. No. 5,500,629 which is herein incorporated by reference.

Still referring to FIG. 1, the physical relationship of common ground conductive plates 14, electrode plates 16a and 16b, electrical conductors 12A and 12B and material 28 will now be described in more detail. The starting point is center common ground conductive plate 14. Center plate 14 has the pair of electrical conductors 12 disposed through their respective insulating apertures 18 which maintain electrical isolation between common ground conductive plate 14 and both electrical conductors 12A and 12B. On either side, both above and below, of center common ground conductive plate 14 are electrode plates 16a and 16b each having the pair of electrical conductors 12A and 12B disposed there through. Unlike center common ground conductive plate 14, only one electrical conductor, 12A or 12B, is isolated from each electrode plate, 16a or 16b, by an insulating aperture 18. One of the pair of electrical conductors, 12A or 12B, is electrically coupled to the associated electrode plate 16a or 16b respectively through coupling aperture 20. Coupling aperture 20 interfaces with one of the pair of electrical conductors 12 through a standard connection such as a solder weld, a resistive fit or any other method which will provide a solid and secure electrical connection. For differential and common mode filter 10 to function properly, upper electrode plate 16a must be electrically coupled to the opposite electrical conductor 12A than that to which lower electrode plate 16b is electrically coupled, that being electrical conductor 12B. Differential and common mode filter 10 optionally comprises a plurality of outer common ground conductive plates 14. These outer common ground conductive plates 14 provide a significantly larger ground plane which helps with attenuation of radiated electromagnetic emissions and provides a greater surface area in which to dissipate over voltages and surges. This is particularly true when plurality of common ground conductive plates 14 are not electrically coupled to circuit or earth ground but are relied upon to provide an inherent ground. As mentioned earlier, inserted and maintained between common ground conductive plates 14 and both electrode plates 16a and 16b is material 28 which can be one or more of a plurality of materials having different electrical characteristics.

Inherent ground 34 will be described in more detail later but for the time being it may be more intuitive to assume that it is equivalent to earth or circuit ground. To couple inherent ground 34, which center and additional common ground conductive plates 14 form, one or more of common ground conductive plates 14 are coupled to circuit or earth ground by common means such as a soldering or mounting screws inserted through fastening apertures 22 which are then coupled to an enclosure or grounded chassis of an electrical device. While differential and common mode filter 10 works equally well with inherent ground 34 coupled to earth or circuit ground, one advantage of filter 10's physical architecture is that a physical grounding connection is unnecessary.

Referring again to FIG. 1 an additional feature of differential and common mode filter 10 is demonstrated by clockwise and counterclockwise flux fields, 24 and 26 respectively. The direction of the individual flux fields is determined and may be mapped by applying Ampere's Law and using the right hand rule. In doing so an individual places their thumb parallel to and pointed in the direction of current flow through electrical conductors 12A or 12B as indicated by the arrows at either ends of the conductors. Once the thumb is pointed in the same direction as the current flow, the direction in which the remaining fingers on the person's hand curve indicates the direction of rotation for the flux fields. Because electrical conductors 12A and 12B are positioned next to one another and represent a single current loop as found in many I/O and data line configurations, the currents entering and leaving differential and common mode filter 10 are opposed thereby creating opposed flux fields which cancel each other and minimize inductance. Low inductance is advantageous in modem I/O and high speed data lines as the increased switching speeds and fast pulse rise times of modem equipment create unacceptable voltage spikes which can only be managed by low inductance surge devices.

It should also be evident that labor intensive aspects of using differential and common mode filter 10 as compared to combining discrete components found in the prior art provides an easy and cost effective method of manufacturing. Because connections only need to be made to either ends of electrical conductors 12 to provide a differential mode coupling capacitor and two common mode decoupling capacitors, time and space are saved.

Figure 1A:
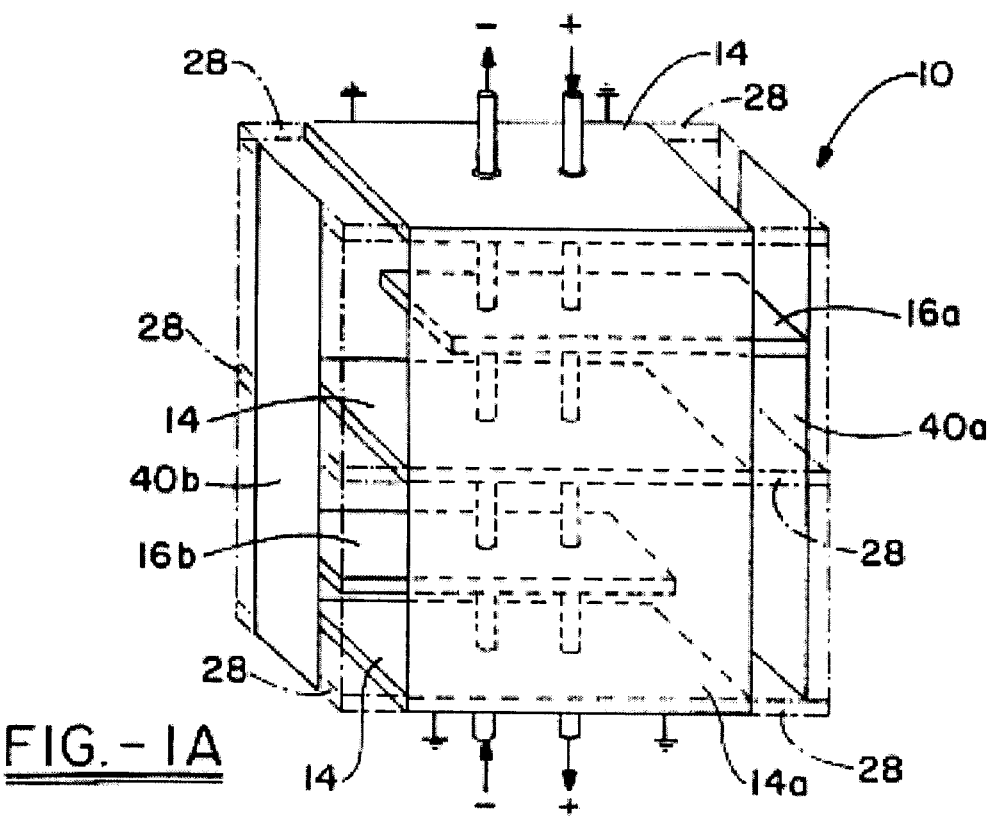
FIG. 1A shows an exploded perspective view of an alternate embodiment of the filter shown in FIG. 1.

FIG. 1A shows an alternative embodiment of filter 10 which includes additional means of coupling electrical conductors or circuit board connections to filter 10. Essentially, the plurality of common ground conductive plates 14 are electrically connected to an outer edge conductive band or surface 14a. Also each electrode plate 16a and 16b has its own outer edge conductive band or surface, 40A and 40B respectively. To provide electrical connections between electrode plate 16a and 16b and their respective conductive band 40A and 40B while at the same time maintaining electrical isolation between other portions of filter 10, each electrode plate 16 is elongated and positioned such that the elongated portion of electrode plate 16a is directed opposite of the direction electrode plate 16b is directed. The elongated portions of electrode plates 16 also extend beyond the distance in which the plurality of common ground conductive plates 14 extend with the additional distance isolated from outer edge conductive bands 40A and 40B by additional material 28. Electrical connection between each of the bands and their associated plates is accomplished through physical contact between each band and its associated common ground conductive or electrode plate.

FIG. 2 shows two representations of differential and common mode filter 10. FIG. 2A is a schematic representation demonstrating that filter 10 provides a line-to-line capacitor 30 between and coupled to electrical conductors 12A and 12B and two line-to-ground capacitors 32 each coupled between one of the pair of the electrical conductors 12 and inherent ground 34. Also shown in dashed lines is inductance 36 which is provided if material 28 is comprised of a ferrite material, as described in more detail later.

FIG. 2B shows a quasi-schematic of the physical embodiment of filter 10 and how it correlates with the capacitive components shown in FIG. 2A. Line-to-line capacitor 30 is comprised of electrode plates 16a and 16b where electrode plate 16a is coupled to one of the pair of electrical conductors 12A with the other electrode plate 16b being coupled to the opposite electrical conductor 12B thereby providing the two parallel plates necessary to form a capacitor. Center common ground conductive plate 14 acts as inherent ground 34 and also serves as one of the two parallel plates for each line-to-ground capacitor 32.

The second parallel plate required for each line-to-ground capacitor 32 is supplied by the corresponding electrode plate 16. By carefully referencing FIG. 1 and FIG. 2B, the capacitive plate relationships will become apparent. By isolating center common ground conductive plate 14 from each electrode plate 16a or 16b with material 28 having electrical properties, the result is a capacitive network having a common mode bypass capacitor 30 extending between electrical conductors 12A and 12B and line-to-ground decoupling capacitors 32 coupled from each electrical conductor 12A and 12B to inherent ground 34.

An alternate embodiment of the present invention is differential and common mode multi-conductor filter 110 shown in FIG. 3. Filter 110 is similar to filter 10 of FIGS. 1 and 1A in that it is comprised of a plurality of common ground conductive plates 112 and a plurality of conductive electrodes 118a thru 118h to form differential mode coupling capacitors and common mode decoupling capacitor arrangements which act on a plurality of pairs of electrical conductors, not shown in FIG. 3 but similar to electrical conductors 12A and 12B shown in FIGS. 1 and 1A. As described earlier for the single pair conductor filter 10 shown in FIG. 1, common ground conductive plates 112, conductive electrodes 118 and the plurality of electrical conductors are isolated from one another by a pre-selected material 122 having predetermined electrical characteristics such as dielectric material, ferrite material, MOV-type material and sintered polycrystalline material. Each of the plurality of common ground conductive plates 112 has a plurality of insulating apertures 114 in which electrical conductors pass while maintaining electrical isolation from the respective common ground conductive plates 112. To accommodate a plurality of electrical conductor pairs, differential and common mode filter 110 must employ a modified version of the electrode plates described in FIGS. 1 and 1A.

To provide multiple independent conductive electrodes for each pair of electrical conductors, a support material 116 comprised of one of the materials 122 containing desired electrical properties is used. Support plate 116A is comprised of a plurality of conductive electrodes 118b, 118c, 118e and 118h printed upon one side of plate 116A with one coupling aperture 120 per electrode. Support plate 116B is also comprised of a plurality of conductive electrodes 118a, 118d, 118f and 118g printed upon one side of plate 116B. Support plates 116A and 116B are separated and surrounded by a plurality of common ground conductive plates 112. The pairs of incoming electrical conductors each have a corresponding electrode pair within filter 110. Although not shown, the electrical conductors pass through the common ground conductive plates 112 and the respective conductive electrodes. Connections are either made or not made through the selection of coupling apertures 120 and insulating apertures 114. The common ground conductive plates 112 in cooperation with conductive electrodes 118a thru 118h perform essentially the same function as electrode plates 16a and 16b of FIGS. 1 and 1A.

As described for FIG. 3, to provide multiple independent components for a number of pairs of electrical conductors, material 122 also serves as support material 116 which is used to fabricate first and second electrode plates 676 and 678. First electrode plate 676 is made up of first and second conductive electrodes 682 and 686 and blocking electrode 688, all printed upon one side of support material 116. Second electrode plate 678 is made up of first and second conductive electrodes 684 and 690 and blocking electrode 692, again printed upon one side of support material 116. First and second electrode plates 676 and 678 are then separated and surrounded by common ground conductive plates 112. What differs in filter 680 from previous embodiments which allows for the combination of differential and common mode filters with built in chassis and board noise blocking capacitors is the configuration of first and second conductive electrodes and blocking electrodes on first and second electrode plates 676 and 678. First and second conductive electrodes 686 and 688 of first electrode plate 676 each include one coupling aperture 120 disposed in the electrode. Blocking electrode 682 is formed to partially surround first and second conductive electrodes 686 and 688 and includes a plurality of insulating apertures 114 and coupling apertures 120. Second electrode plate 678 is identical to first electrode plate 676 with first and second conductive electrodes 690 and 692 corresponding to first and second conductive electrodes 686 and 688 and blocking electrode 684 corresponding with blocking electrode 682.

Again referring to FIG. 3, multi-conductor filter 110 is shown having not only a center common ground conductive plate 112 but outer common ground conductive plates 112. As described in relation to FIGS. 1 and 1A these outer common ground conductive plates 112 provide a significantly larger ground plane for filter 110 which helps with attenuation of radiated electromagnetic emissions, provides a greater surface area to dissipate and/or absorb over voltages, surges and noise, and effectively acts as a Faraday shield. This is particularly true when plurality of common ground conductive plates 112 are not electrically connected to circuit or earth ground but are instead relied upon to provide an inherent ground.

Figures 4A, 4B:
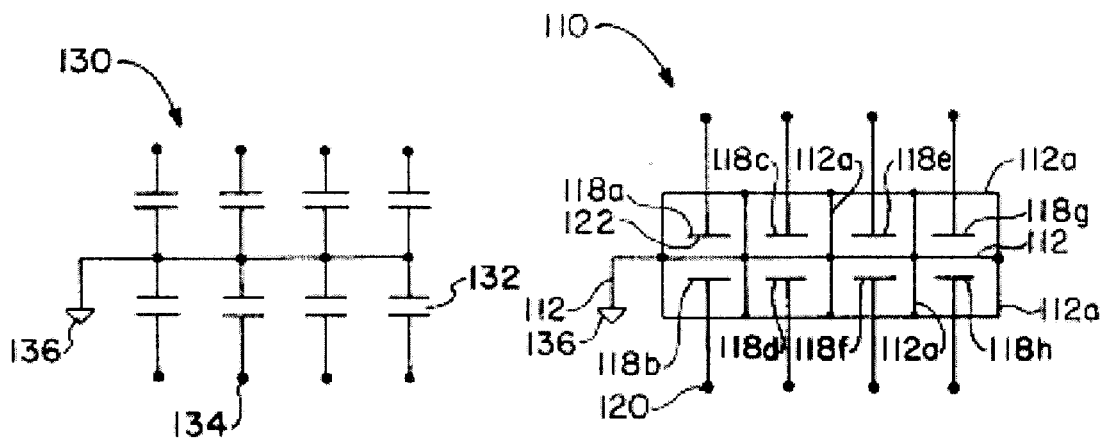
FIG. 4 shows schematic representations of the differential and common mode filter and prior art filters with FIG. 4A being a multi-capacitor component as found in the prior art and FIG. 4B being the electrical representation of the physical embodiment of the differential and common mode filter of FIG. 3.

FIG. 4 shows schematic diagrams of prior art multi-capacitor components and differential and common mode multi-conductor filter 110 of the present invention. FIG. 4A is a schematic of prior art capacitor array 130. Essentially, a plurality of capacitors 132 are formed and coupled to one another to provide common ground 136 for array 130 with open terminals 134 provided for connecting electrical conductors to each capacitor 132. These prior art capacitor arrays only allowed common mode decoupling of individual electrical conductors when open terminal 134 of each capacitor 132 was electrically connected to individual electrical conductors.

FIG. 4B shows a schematic representation of differential and common mode multi-conductor filter 110 having four differential and common mode filter pin pair pack arrangements. The horizontal line extending through each pair of electrodes represents the common ground conductive plates 112 with the lines encircling the pairs being the isolation bars 112A. The isolation bars 112A are electrically coupled to common ground conductive plates 112 providing an inherent ground grid separating each of the electrode plates 118a through 118h from one another. The corresponding conductive electrodes 118a thru 118h positioned on support material plates 116A and 116B, both above and below the center common ground conductive plate 112, and form line-to-ground common mode decoupling capacitors. Each plate, common ground plates 112 and support material plates 116A and 116B, is separated from the others by dielectric material 122. When filter 110 is connected to paired electrical conductors via coupling apertures 120 such as those found in electrode plates 118a and 118c, filter 110 forms a line-to-line differential mode filtering capacitor.

A further variation of the present invention is differential and common mode multi-conductor filter 680 shown in FIG. 9. Filter 680 has been optimized for use with computer and telecommunications equipment and in particular has been configured for use with RJ 45 connectors. To obtain improved filters performance, filter 680 includes built in chassis and circuit board low frequency noise blocking capacitors in addition to a plurality of differential and common mode filters. As shown in FIG. 9A, the physical construction of filter 680 is substantially similar to filter 110, shown in FIG. 3, and is comprised of a plurality of common ground conductive plates 112, first and second electrode plates 676 and 678 having a plurality of conductive electrodes to form multiple differential and common mode filters including chassis and board blocking capacitors. As described for earlier embodiments, common ground conductive plates 112, conductive electrodes 686, 688, 690 and 692, blocking electrodes 682 and 684, and the electrical conductors (not shown) which pass through the various plates are all isolated from one another by material 122. To realize particular predetermined electrical characteristics in filter 680, as in all other embodiments of the present invention, material 122 can consist of dielectrics, ferrites, MOV-type material or sintered polycrystalline. Each common ground conductive plate 112 includes a plurality of insulating apertures 114 in which electrical conductors pass while maintaining electrical isolation from common ground conductive plate 112. To obtain the additional chassis and board noise blocking capacitors, filter 680 employs a modified version of the electrode plates of FIG. 1.

Figure 9A:
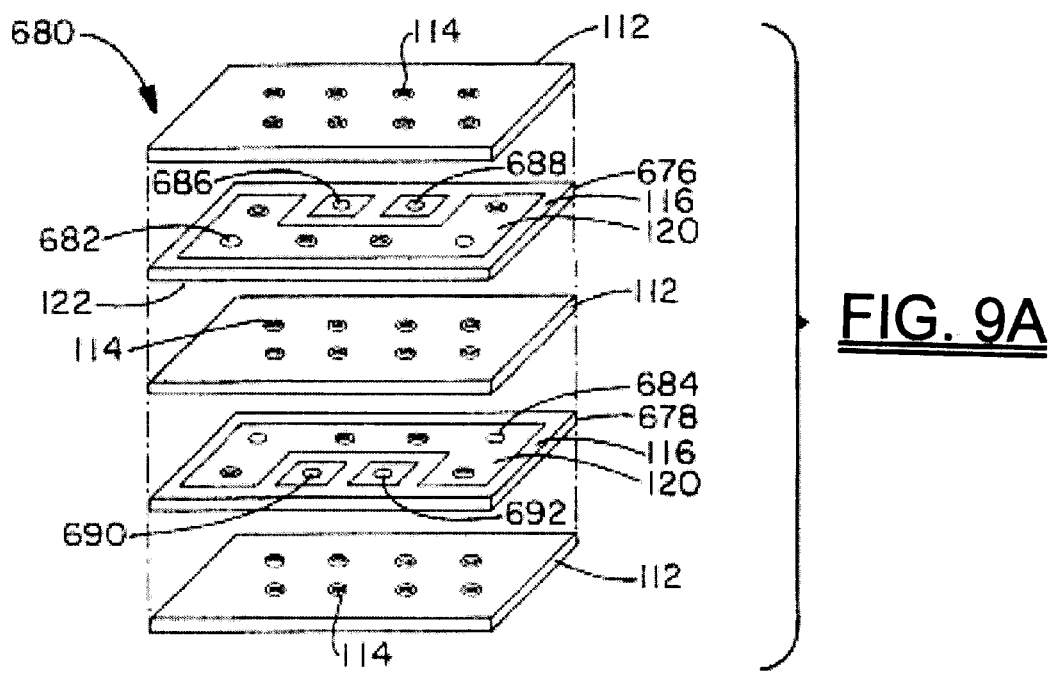
FIG. 9a is an exploded prospective view of an alternate multi-conductor differential and common mode filter for use in connector applications.

As is clearly shown in FIG. 9A, when coupled between the various common ground conductive plates 112, first and second electrode plates 676 and 678 are arranged in opposite directions from one another. This particular alignment of first and second electrode plates 676 and 678 allows filter 680 to have a traditional RJ 45 pin-out configuration when used in a connector application. It should be noted that Applicant contemplates other configurations of conductive and blocking electrodes depending upon the desired pin-out or wiring arrangement desired and the inverted arrangement of first and second electrode plates 676 and 678 is not required.

Figure 9B:
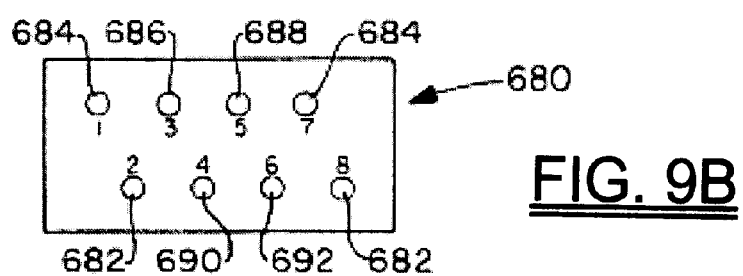

As in other embodiments, a number of electrical conductors will pass through common ground conductive plates 112 and first and second electrode plates 676 and 678. Although the electrical conductors are absent, FIG. 9B shows that this particular embodiment of filter 680 is adapted to accept eight conductors in accordance with RJ 45 connector standards. The interaction of the various conductive electrodes within filter 680 will now be described by referring FIGS. 9A through 9D with FIG. 9B included to further correlate the electrical representation with the physical embodiment of filter 680. FIG. 9D is an alternate electrical representation of filter 680 which should also be referred to as needed. Signal ground (SG) for filter 680 is provided by the combination of common ground conductive plates 112 which act as an inherent ground. The physical separation of the various conductive electrodes of first and second electrode plates 676 and 678 by the conductive plane of common ground conductive plates 112 provides a substantial ground plane for filter 680 which inherently acts as a ground and assists with attenuation of radiated electromagnetic admissions, provides a greater surface area to dissipate and/or absorb over voltages, surges and noise, and effectively acts as a Faraday shield protecting the filter from external electrical noise and preventing radiation of the same by filter 680.

Figure 9C:
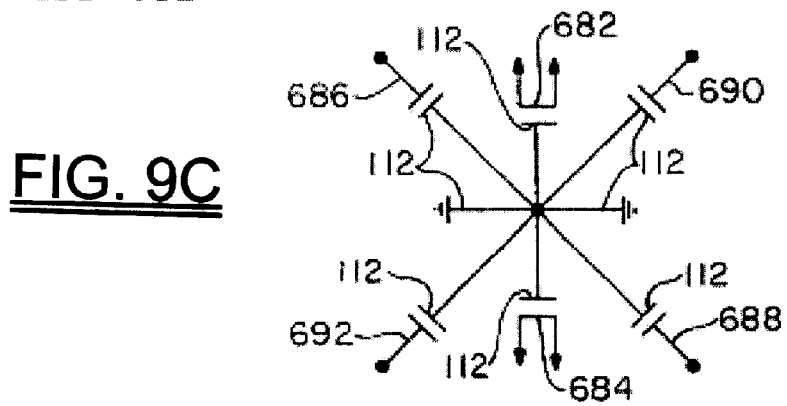
Figure 9D:
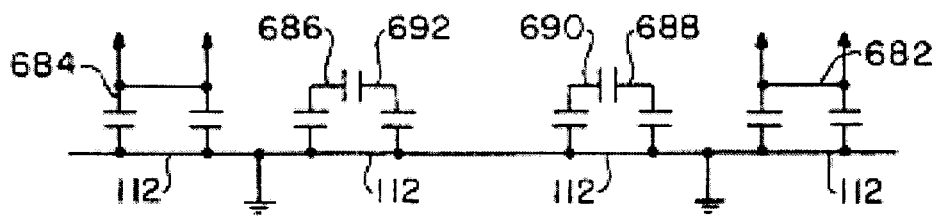

Referring to the various electrical conductors (not shown) by the numbers 1 through 8 as shown in FIGS. 9B, 9C and 9D, the electrical conductors 3 and 5 are connected through coupling apertures 120 to first and second conductive electrodes 686 and 688 respectively. Electrical conductors 4 and 6 are connected through coupling apertures 120 to conductive electrodes 690 and 692 respectively. Conductors 1 and 7 are connected through coupling apertures 120 to blocking electrode 684 and electrical conductors 2 and 8 are similarly connected through coupling apertures 120 to blocking electrode 682. Referring to FIG. 9D, electrical conductors 3 and 6 are filtered differentially by the interaction of first and second conductive electrodes 686 and 692 which act as opposing plates to form a line-to-line capacitor between electrical conductors 3 and 6. The same electrical conductors each receive common mode filtering through line-to-ground capacitors formed by the interaction of first and second conductive electrodes 686 and 692 with common ground conductive plates 112 which forms line-to-ground capacitors between each electrical conductor and the inherent ground formed by the plurality of common ground conductive plates 112.

The same relationship exists for electrical conductors 4 and 5 which are connected to first and second conductive electrodes 690 and 688 respectively. First and second conductive electrodes 690 and 688 form line-to-line capacitors and each interacts with common ground conductive plates 112 to form individual common mode filter capacitors for each electrical conductor. In addition to the plurality of differential and common mode filters created by the interaction between the various conductive electrodes and common ground conductive plates, chassis and board noise blocking capacitors are also formed by the interaction of common ground conductive plates 112 and blocking electrodes 682 and 684. For instance, chassis ground is connected to the electrical conductors 1 and 7, both of which are electrically connected through coupling apertures 120 to blocking electrode 682 thereby forming one plate of the noise blocking capacitors. The other plate of the noise blocking capacitors is formed by common ground conductive plates 112 which interact with blocking electrode 682. Although interchangeable, electrical conductors 2 and 8 also provide board noise blocking capacitors formed by the interaction of common ground conductive plates 112 and blocking electrode 682. Both the chassis and board blocking noise capacitors allow the inherent ground formed by common ground conductive plates 112 to be capacitively decoupled thereby blocking low frequency electrical noise from the signal carrying conductors. This improves differential and common mode filter performance by essentially electrically cleansing the inherent ground formed by common ground conductive plates 112.

Figure 5:
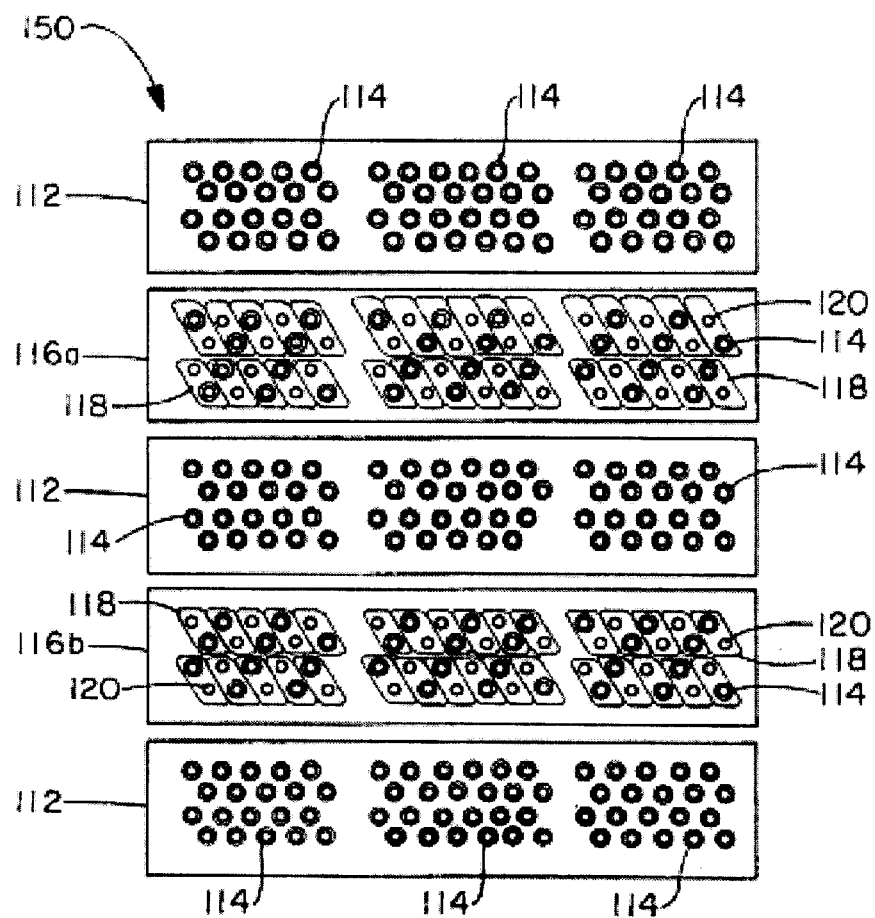
FIG. 5 is a top plan view of the plurality of common ground conductive and electrode plates which make up a high density multi-conductor differential and common filter embodiment.

FIG. 5 illustrates a further embodiment of the present invention which provides input/output data line pair filtering for a large number of electrical conductor pairs typical of today's high density information and data buses. Differential and common mode high density filter 150 is comprised of a plurality of common ground conductive plates 112 containing a plurality of insulating apertures 114 and conductive electrode plates 116A and 116B each having electrode patterns 118, insulating apertures 114 and coupling apertures 120. The stacking sequence is reflected in FIG. 5 recognizing that dielectric material will surround each of the individual plates as described for previous embodiments.

Figure 6A:
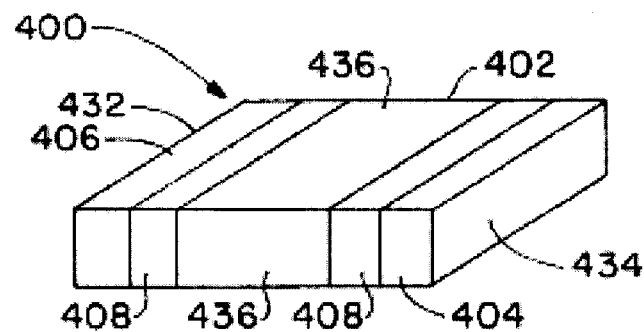
FIG. 6 shows a surface mount chip embodiment of a differential and common mode filter with FIG. 6A being a perspective view and FIG. 6B showing an exploded perspective view of the same.
Figure 6B:
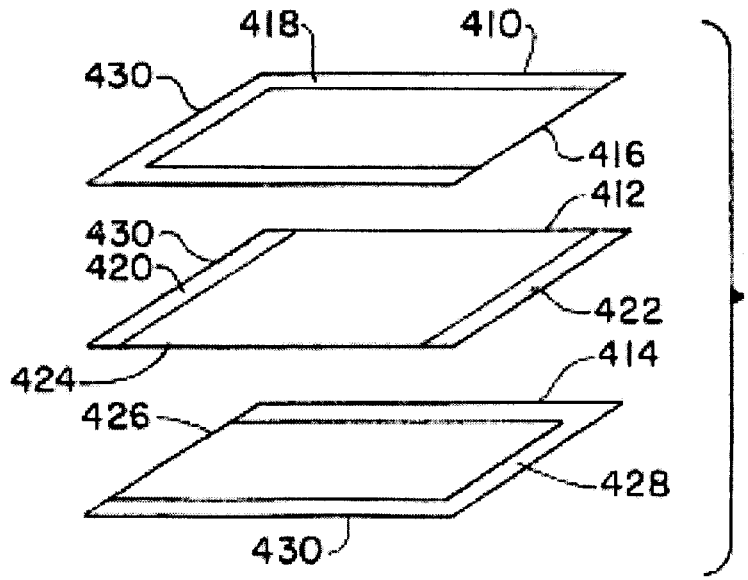
Figure 7A:
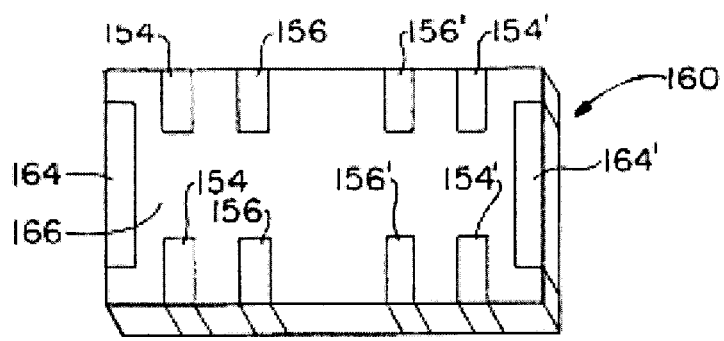
Figure 7B:
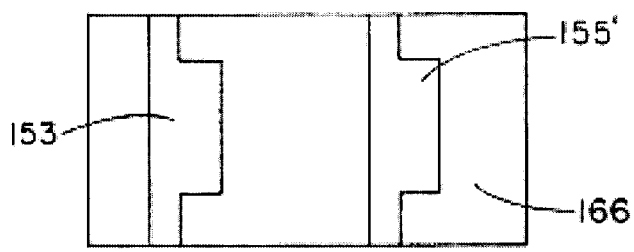
FIGS. 7b through 7d shows top plan views of internal electrode layers.
Figure 7C:
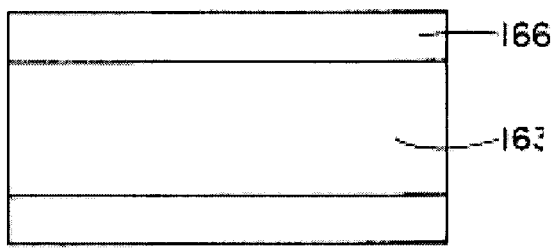
Figure 7D:
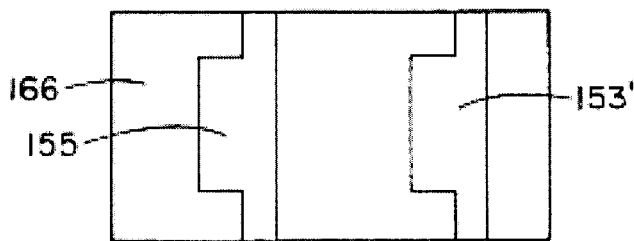
Figure 7E:
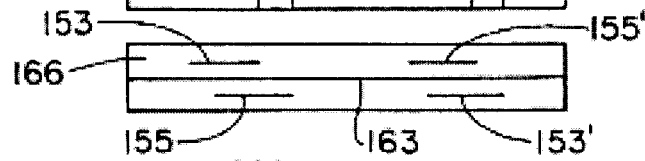

One trend found throughout modem electronic devices is the continuous miniaturization of equipment and the electronic components which make up that equipment. Capacitors, the key component in differential and common mode filter arrangements, have been no exception and their size has continually decreased to the point where they may be formed in silicon and imbedded within integrated circuits only seen with the use of a microscope. One miniaturized capacitor which has become quite prevalent is the chip capacitor which is significantly smaller than standard through hole or leaded capacitors. Chip capacitors employ surface mount technology to physically and electrically connect to electrical conductors and traces found on circuit boards. The versatility of the architecture of the differential and common mode filter of the present invention extends to surface mount technology as shown in FIG. 6. Surface mount differential and common mode filter 400 is shown in FIG. 6A with its internal construction shown in FIG. 6B. Referring to FIG. 6B, common ground conductive plate 412 is sandwiched between first differential plate 410 and second differential plate 414. Common ground conductive plate 412 and first and second differential plates 410 and 414 are each comprised of material 430 having desired electrical properties dependant upon the material chosen. As for all embodiments of the present invention, Applicant contemplates the use of a variety of materials such as but not limited to dielectric material, MOV-type material, ferrite material, film such as Mylar and newer exotic substances such as sintered polycrystalline.

First differential plate 410 includes conductive electrode 416 coupled to the top surface of material 430 in a manner which leaves isolation band 418 surrounding the outer perimeter of first differential plate 410 along three of its four sides. Isolation band 418 is simply a portion along the edge of material 430 that has not been covered by conductive electrode 416. Second differential plate 414 is essentially identical to first differential plate 410 with the exception being its physical orientation with respect to that of first differential plate 410. Second differential plate 414 is comprised of material 430 having conductive electrode 426 coupled to the top surface of material 430 in such a manner as to leave isolation band 428 surrounding the outer perimeter of second differential plate 414 along three of its four sides. What is important to note about first and second differential plates 410 and 414's physical orientation with respect to one another is that the one side of each plate in which isolation bands 418 and 428 do not circumscribe, are arranged 180 degrees apart from one another. This orientation allows each electrical conductor to be coupled to either individual plate 410 or 414 but not both.

Common plate 412 is similar in construction to first and second differential plates 410 and 414 in that it too includes material 430 with common conductive electrode 424 coupled to its top surface. As can be seen from FIG. 6B, common plate 412 has two isolation bands 420 and 422 positioned at opposite ends. Common plate 412 is aligned in between first and second differential plates 410 and 414 so that isolation bands 420 and 422 are aligned with the ends of first and second differential plates 410 and 414 which do not have isolation bands. All three plates, common plate 412 and first and second differential plates 410 and 414 do not have any type of conductive surface beneath each plate and therefore when the plates are stacked one on top of the other, conductive electrode 426 is isolated from common conductive electrode 424 by the backside of common plate 412. In a similar fashion common conductive electrode 424 is isolated from conductive electrode 416 by the backside of first differential plate 410 which is comprised of material 430.

Referring now to FIG. 6A the construction of surface mount differential and common mode filter 400 will be further described. Once common plate 412 and first and second differential plates 410 and 414 are sandwiched together according to the arrangement shown in FIG. 6B, a means for coupling electrical conductors to the different electrodes must be included. Electrical conductors are coupled to surface mount differential and common mode filter 400 through first differential conductive band 404 and second differential conductive band 406 which are isolated from common conductive band 402 by isolation bands 408 positioned in between bands 402, 404 and 406. Common conductive band 402 and isolation bands 408 extend 360 degrees around the body of filter 400 to provide isolation on all four sides. First and second differential conductive bands 404 and 406 not only extend 360 degrees around filter 400 but also extend to cover ends 432 and 434, respectively.

By referring back and forth between FIGS. 6A and 6B, the coupling between the bands and the plates can be seen. First differential conductive band 404 including end 434 maintains electrical coupling with conductive electrode 416 which does not have isolation band 418 extending to the end of first differential plate 410. Second differential conductive band 406 is electrically isolated from common plate 412 and first differential plate 410 due to isolation band 422 and 428 respectively. In a similar fashion to that just described, second differential conductive band 406 including end 432 is electrically coupled to conductive electrode 426 of second differential plate 414. Due to isolation bands 420 and 418 of common plate 412 and first differential plate 410, second differential conductive band 406 is electrically isolated from first differential plate 410 and common plate 412.

Electrical coupling of common conductive band 402 to common plate 412 is accomplished by the physical coupling of sides 436 of common conductive band 402 to common conductive electrode 424 which lacks isolation bands along the sides of common plate 412. To maintain electrical isolation of common conductive electrode 424 from first and second differential conductive bands 404 and 406, isolation bands 420 and 422 of common plate 412 prevent any physical coupling of ends 432 and 434 of first and second differential conductive bands 404 and 406 with common conductive electrode 424.

As with the other embodiments of the differential and common mode filter of the present invention, conductive electrodes 416 and 426 of first and second differential plates 410 and 414 act as a line-to-line differential mode capacitor when electrical conductors are coupled to first and second differential conductive bands 404 and 406. Line-to-ground decoupling capacitors are formed between each conductive electrode, 416 and 426 respectively, and common conductive electrode 424 which provides the inherent ground.

FIG. 7 shows an alternative multi-component surface mount differential and common mode filter which combines two individual filters into one electronic component. It should be understood that any number of individual filters can be incorporated into a single electronic component and that the invention is not limited to two individual filters. FIG. 7A shows one interconnect arrangement with FIG. 7B through 7E disclosing the internal electrode and common ground conductive layers. First and second differential conductive bands 154 and 156 are coupled to electrode plates 153 and 155 respectively and bands 154' and 156' are similarly coupled to electrode plates 153' and 155'. Multi-component surface mount filter 160 is also comprised of material 166 having predetermined electrical properties, as described previously, disbursed in between the plurality of electrode and common ground conductive layers. Common ground conductive band 164 is electrically connected to common ground conductive plate 163. What should be noted is that not only does Applicant contemplate multiple components within a single electronic package but that the shape and arrangement and/or length and width of first and second differential conductive bands 154 and 156 and common conductive band 164 may be varied to accompany any type of printed circuit board footprint desirable. The conductive and common bands are only required to be electrically coupled to the associated electrode plates and common ground conductive plate 163 while maintaining electrical isolation among one another. The concept disclosed in FIG. 7 could just as easily be extended to incorporate 10, 20 or 100 differential and common mode filters if desired. Multi-component surface mount differential and common mode filter 160 is particularly useful for providing filtering to large data buses typically consisting of 32 or 64 data lines. These data buses handle digital information at extremely high frequencies emitting large amounts of electromagnetic energy and are also extremely susceptible to over currents and voltage surges which can damage circuitry and distort data.

FIGS. 10 and 11 show a further alternative multi-component surface mount differential and common mode filter designed to provide a strip of filters for varied use. This specific design is for use with multi conductor electronic connectors. As in other embodiments of the present invention, strip filter 642 is comprised of a plurality of common ground conductive plates 656 with first and second electrode plates 662 and 664 sandwiched in between the various common ground conductive plates 656. Strip filter 642, shown in FIG. 10, has four sets of differential and common mode filters. Each common ground conductive plate 656 is etched upon support material 616 having predetermined electrical properties, as disclosed throughout the specification, so that portions of material 616 act as insulation on either side of each common ground conductive plate 656 with only ground extensions 660 extending to the edges of support material 616. The various first and second electrode plates 662 and 664 are also formed on strips of support material 616 so that each electrode plate is surrounded by material 616 except for electrode extensions 666 which extend to the edges of support material 616. As can be seen in FIG. 10, each electrode extension 666 of each first electrode plate 662 extends in an opposite direction from the electrode extension 666 of the corresponding second electrode plate 664. The arrangement of ground extensions 660 and electrode extensions 666 can be reconfigured in numerous patterns as long as a convenient layout for electrical conductor coupling is created As in the various other embodiments of the present invention, each differential and common mode filter included in strip filter 642 consists of a first and second electrode plate 662 and 664 sandwiched between common ground conductive plates 656 with additional material having predetermined electrical properties (not shown) disposed between and electrically isolating the various ground and electrode plates from one another. FIG. 11 shows top, bottom and side views of strip filter 642 having first and second differential conductive bands 652 and 654 running perpendicular to the lengths of support material 616 and slightly overlapping onto the top of strip filter 642, as shown in FIG. 11A. The bottom of strip filter 642, as shown in FIG. 11D, is the same as the top to allow for surface mounting of strip filter 642. Common ground conductive bands 650 extend vertically up the ends and onto the top and bottom of strip filter 642, as indicated by the portions labeled 650 in FIGS. 11A and 11D. Additional common ground conductive bands 650 are also found on the top and bottom of strip filter 642 but in this configuration they do not extend down the sides. First and second differential conductive bands 652 and 654 extend down the corresponding sides of strip filter 642 allowing the various electrode extensions 666 of each of the first and second electrode plates 662 and 664 to electrically couple to their respective conductive bands thereby allowing connection of external electrical conductors to the various internal electrode plates of strip filter 642. For purposes of clarity, the corresponding first and second electrode plates 662 and 664 and first and second differential conductive bands 652 and 654 include suffix designations (a) through (d) which represents each of the four differential and common mode filters included within strip filter 642.

Figure 8A:
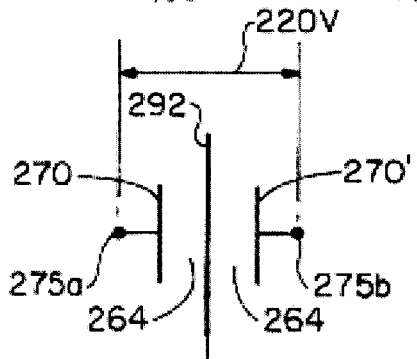
FIG. 8 shows a high power embodiment of the differential and common mode filter with FIG. 8A being a schematic representation of the filter and FIG. 8B being a partial schematic/block diagram of the same.
Figure 8B:
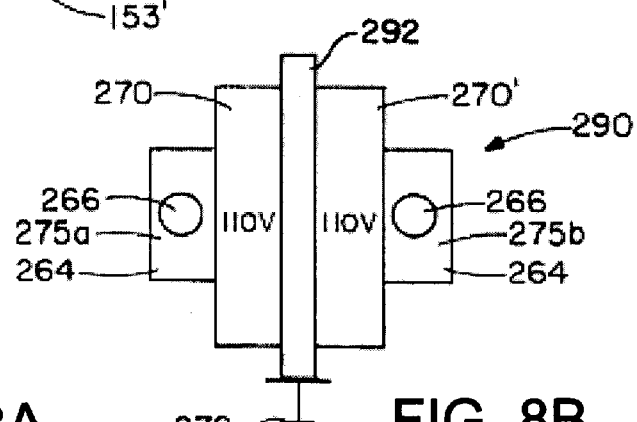

FIG. 8 shows a high-power embodiment of the differential and common mode filter of the present invention. FIG. 8A shows a quasi-schematic representation of the physical arrangement of plates which make up the filter shown in FIG. 8B. Referring to both FIGS. 8A and 8B it can be seen that common ground conductive plate 292 is again sandwiched between two conductive electrode plates, 270 and 270', which are individually connected/coupled to electrical conductors 275A and 275B. Each conductive electrode plate, 270 and 270', consists of a material 264 having specific predetermined properties, with each plate then having a conductive surface to which electrical connections are made. After electrical conductors 275A and 275B are connected to conductive electrode plates 270 and 270', the conductive surface is coated with insulation. Conductive electrode plates 270 and 270' are physically coupled to common ground conductive plate 292 via typical adhesive material known in the art.

Figure 12:
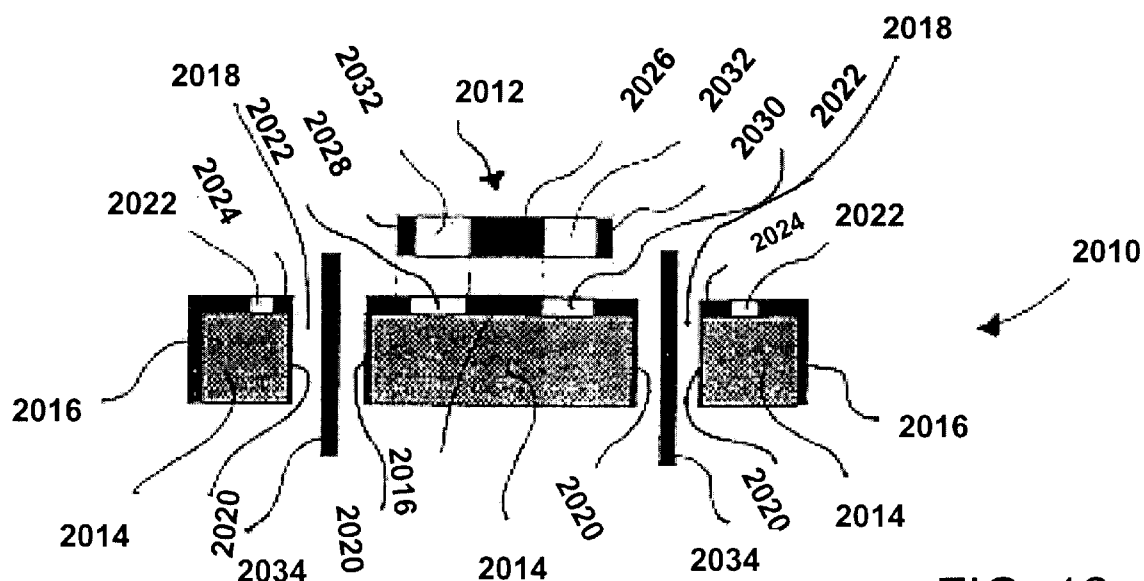
FIG. 12 is an elevational view in cross section of a single-sided surface mount component carrier of the present invention.

Illustrated in FIG. 12 is surface mount component carrier 2010 for maintaining a ceramic planar surface mount electrical component, such as a differential and common mode filter as is disclosed above and in application Ser. No. 09/008,769, now U.S. Pat. No. 6,097,581, which is a continuation-in-part of application Ser. No. 08/841,940, now U.S. Pat. No. 5,909,350, both of which are previously incorporated herein by reference.

Carrier 2010 is a disk comprised of an insulator 2014, such as ceramic, having at least two apertures 2018. Insulator 2014 is covered by a conductive metalized ground surface 2016, at least two conductive pads 2024 surrounding apertures 2018, and insulating bands 2022 surrounding each conductive pad 2024. Insulating bands 2022 separate and electrically isolate conductive pads 2024 from metalized ground surface 2016. In the top plan view of carrier 2010, shown in FIG. 13, the preferred embodiment of the invention is circular in shape with square insulating bands 2022 surrounding partially rounded conductive pads 2024. Carrier 2010 and its various elements can be formed into many different shapes and Applicant does not intend to limit the scope of the invention to the particular shapes shown in the drawings.

Referring again to FIG. 12, in the preferred embodiment, metalized ground surface 2016 covers a substantial portion of the top and sides of carrier 2010. Through-hole plating 2020 covers the inner walls of aperture 2018 and electrically couples to the corresponding conductive pad 2024. Through-hole plating 2020 provides greater surface area for electrical coupling of conductors 2034 to conductive pads 2024 as the conductors 2034 are disposed through apertures 2018. The configuration of metalized ground surface 2016, insulating bands 2022 and conductive pads 2024 provide the necessary contacts for connecting a surface mount component, such as differential and common mode filter 2012, to the upper surface of carrier 2010, which in turn provides electrical connection between conductors 2034 and surface mount component 2012. The surface mount components referred to, such as differential and common mode filter 2012, are provided in standard surface mount packages which include a number of solder terminations for electrically coupling the device to external circuitry or in this case to carrier 2010. Filter 2012 includes first differential electrode band 2028 and second differential electrode band 2030 extending from either end of filter 2012. Extending from the center of filter 2012 is at least one and more typically two, common ground conductive bands 2026. An insulated outer casing 2032 electrically isolates first and second differential electrode bands 2028 and 2030 and common ground conductive bands 2026 from one another. A top plan view of a standard surface mount device as just described is shown in FIG. 18 as differential and common mode filter 1040. The filter 1040 is comprised of first differential conductive band 1160, second differential conductive band 1180 and two common ground conductive bands 1200. The insulated outer casing 1220 separates and electrically isolates each of the various conductive bands from one another.

FIG. 12 shows filter 2012 positioned upon the top surface of carrier 2010 so that the common ground conductive bands 2026 come in contact with the portion of the metalized ground surface 2016 which separates both of the insulating bands 2022 from one another. This is accomplished by positioning differential and common mode filter 2012 lengthwise between the two conductive pads 2024 such that first differential electrode band 2028 is in contact with one of the two conductive pads 2024 and second differential electrode band 2030 comes in contact with the other conductive pad 2024. Once filter 2012 has been positioned, by default, insulated outer casing 2032 of filter 2012 aligns with portions of insulating bands 2022 thereby maintaining electrical isolation between the various conductive and electrode bands of filter 2012. First and second differential conductive bands 2028 and 2030 and the common ground conductive bands 2026 consist of solder terminations found in typical surface mount devices. Once filter 2012 is positioned upon carrier 2010 standard solder re-flow methods are employed causing the solder terminations to re-flow thereby electrically coupling and physically bonding filter 2012 to carrier 2010. Customary solder re-flow methods which can be used include infrared radiation (IR), vapor phase and hot air ovens or any other means which can be used to expose the solder to sufficiently elevated temperatures. Once differential and common mode surface mount filter 2012 is coupled to carrier 2010, the combination of the two parts can be manipulated, either manually or through various types of automated equipment, without subjecting filter 2012 to mechanical and physical stresses normally associated with the handling of miniature and delicate electronic components.

Once coupled to carrier 2010, filter 2012 is electrically connected to external circuitry through conductors 2034 which may consist of wire leads or lengths of flexible wire. Once disposed through apertures 2018, conductors 2034 are soldered to conductive pads 2024 and within apertures 2018. Thru-hole plating 2020 allows solder applied to conductive pads 2024 and conductors 2034 to flow into apertures 2018 thereby adhering to the thru-hole plating. Component carrier 2010 reduces mechanical and physical stresses such as shock, vibration and various thermal conditions which filter 2012 would otherwise be subjected to and provides a complete ground shield for filter 2012. Because carrier 2010 has a greater surface area then filter 2012 and a substantial portion of that surface area is covered by metalized ground surface 2016, carrier 2010 acts as a ground shield which absorbs and dissipates electromagnetic interference and over voltages. These added benefits improve the overall functional performance and characteristics of filter 2012.

Figure 14:
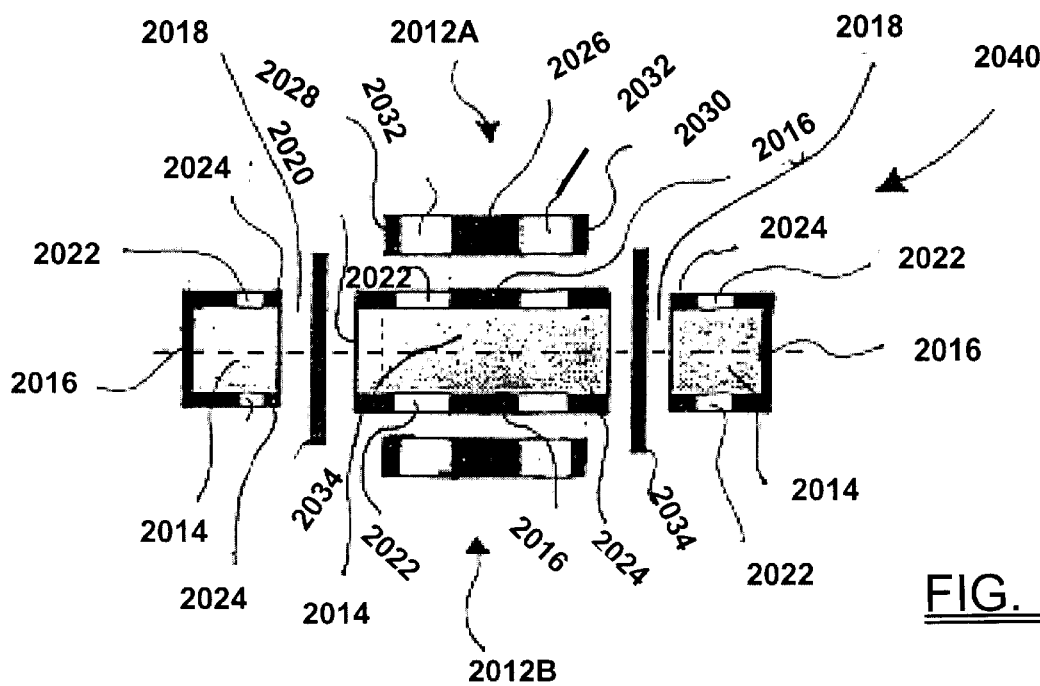
FIG. 14 is an elevational view in cross section of a double-sided surface mount component carrier of the present invention.
Figure 15:
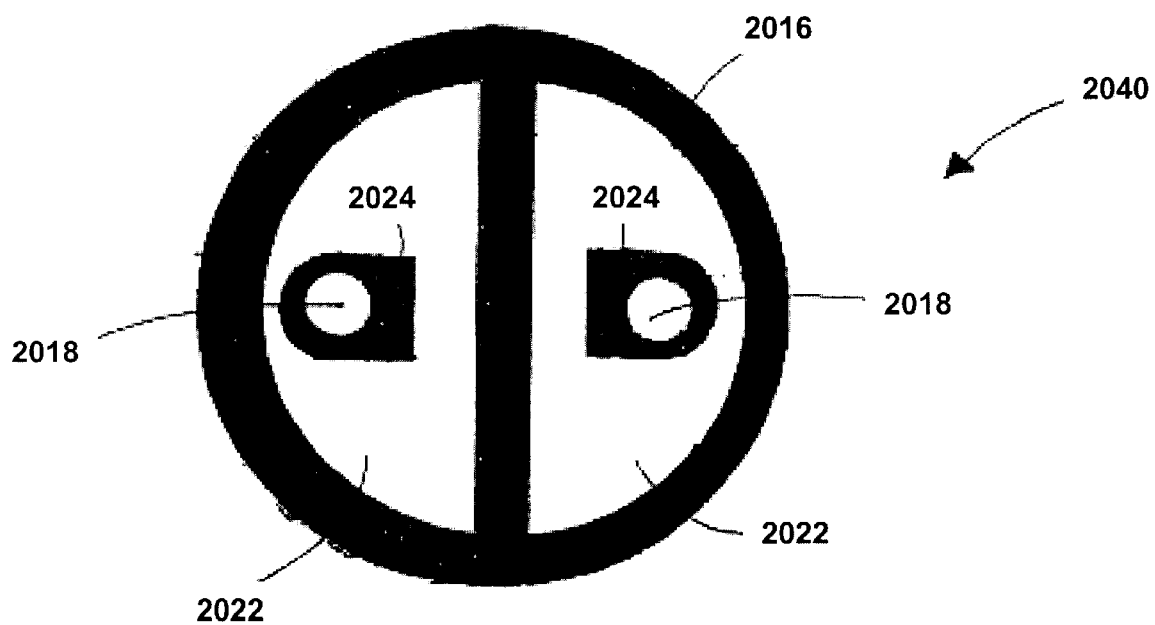
FIG. 15 is a top plan view of the surface mount component carrier shown in FIG. 14.

FIGS. 14 and 15 illustrate a further alternate embodiment of the present invention, that being double-sided carrier 2040. Carrier 2040 is identical to carrier 2010, as shown in FIG. 12, except that carrier 2040 is double-sided and as a bottom surface which is substantially identical to the top surface. This configuration allows two differential and common mode surface mount filters 2012A and 2012B to be mounted to the upper and lower surfaces of carrier 2040. As illustrated in FIG. 14, metalized ground surface 2016 covers substantial portions of the top, sides and bottom of carrier 2040 providing a greater overall surface area. The increased surface area of metalized ground surface 2016 imparts greater shielding characteristics in carrier 2040 which absorb and dissipate electromagnetic interference. In addition, both the top and bottom of carrier 2040 include corresponding conductive pads 2024 which are electrically connected to one another by thru-hole plating 2020 which covers the inner walls of apertures 2018.

Double-sided carrier 2040 is also advantageous in that it allows for flexibility needed to meet electromagnetic interference (EMI) and surge protection requirements simultaneously through integration of different surface mount components on the same carrier substrate. As an example, a differential and common mode filter, as previously described, could be coupled to the top of carrier 2040 while a MOV device could be coupled on the bottom of carrier 2040 effectively placing the filter and MOV devices in parallel to provide EMI and surge protection in one compact, durable package. Because carrier 2040 provides a rigid base for maintaining various electronic surface mount components, the components themselves are subjected to less physical stress during manufacturing processes which in turn increases yields and lowers manufacturing costs.

Figure 13:
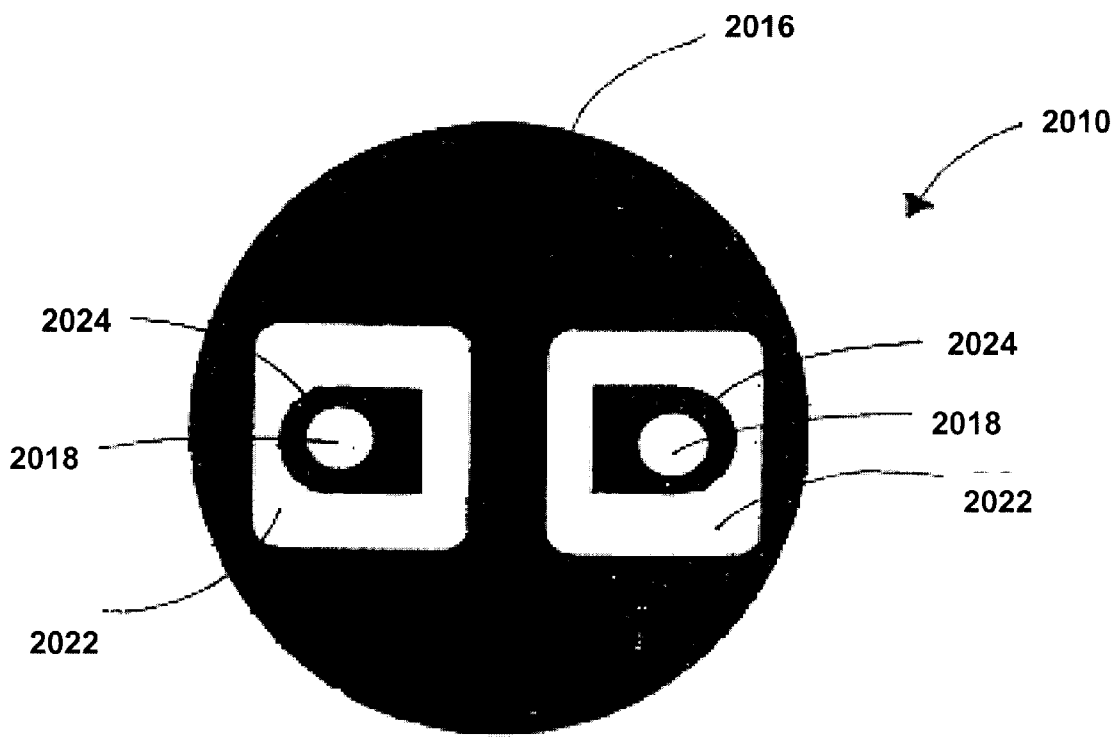
FIG. 13 is a top plan view of the surface mount component carrier shown in FIG. 12.

FIG. 15 shows a modified configuration of metalized ground surface 2016, conductive pads 2024 and insulating bands 2022. In this alternative embodiment, insulating bands 2022 have been substantially increased such that the surface area of carrier 2040 is substantially covered by insulation as opposed to a metalized ground surface. This configuration can be used when decreased shield characteristics are desired or the particular interaction between carrier 2040 and the surface mount component needs to be precisely controlled. One example is when parasitic capacitance values must be maintained below a certain level. Note that the particular shapes of insulating bands 2022, shown in FIG. 15, are not necessary. All that is required is that the surface area covered by metalized ground surface 2016 be varied which in turn varies the electrical characteristics of double-sided carrier 2040. It should also be noted that the surface pattern shown in FIG. 13 can be used with the double-sided carrier 2040, shown in FIG. 14, or the surface pattern shown in FIG. 15 could just as easily be used with carrier 2010, shown in FIG. 12. To obtain further control of the electrical characteristics of double-sided carrier 2040, one surface could be configured as shown in FIG. 15 while the other surface, either top or bottom, could be configured as shown in FIG. 13. Altering the upper and lower surface patterns of double-sided carrier 2040 depending upon the types of surface mount components coupled to carrier 2040 allows for obtaining optimal electrical characteristics as needed.

Figure 16:
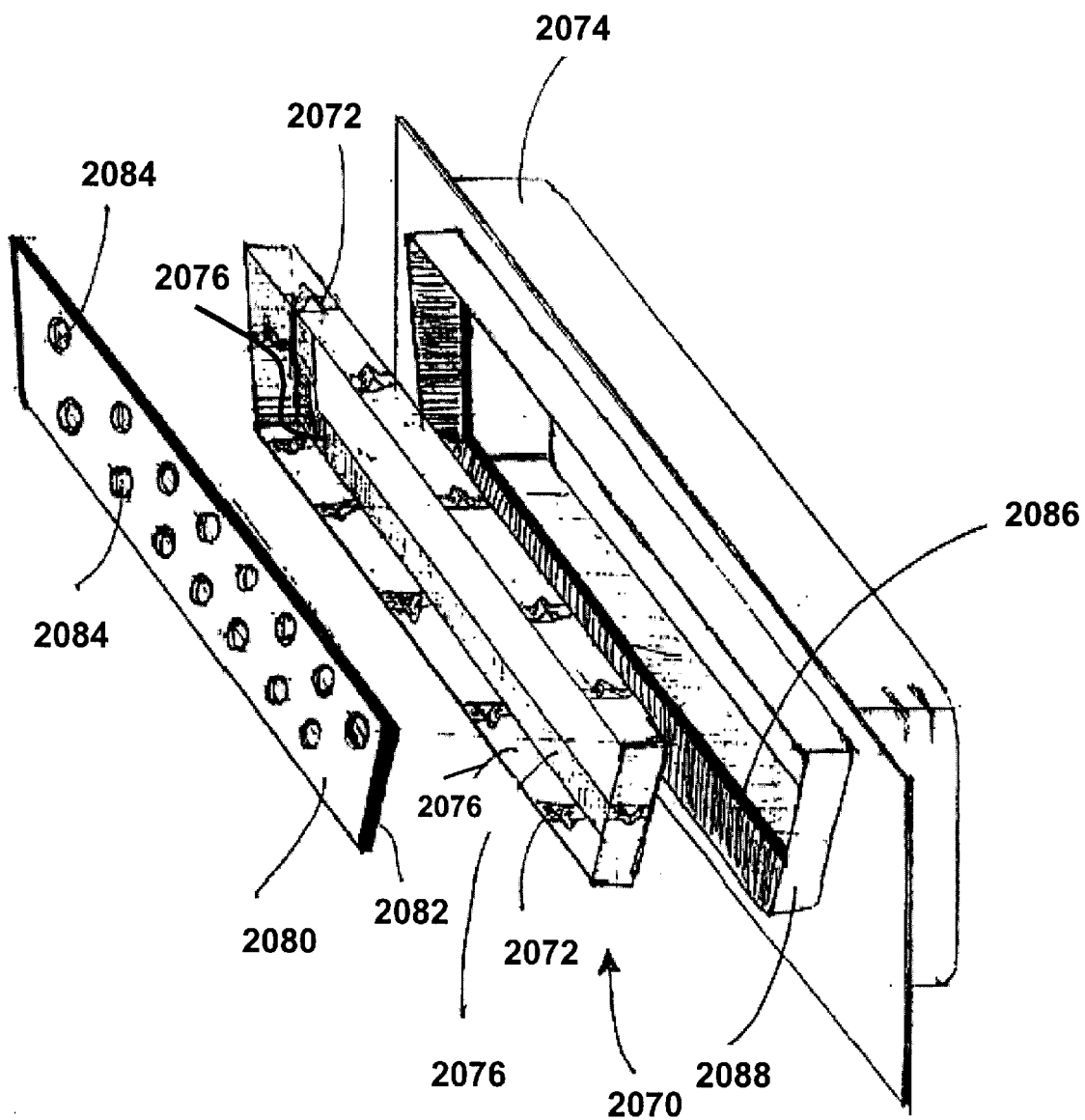
FIG. 16 is an exploded perspective view of the connector carrier of the present invention in operable cooperation with a standard connector shell and a multi-conductor filter.

FIG. 16 shows an exploded prospective view of D-sub connector shell 2074, connecter carrier 2070 and multi-conductor filter 2080. While carrier 2070 can be used with a variety of filters, Applicant contemplates multi-conductor filter 2080 being a differential and common mode multi-conductor filter as disclosed in application Ser. No. 09/008,769, now U.S. Pat. No. 6,097,581, which is a continuation-in-part of application Ser. No. 08/841,940, now U.S. Pat. No. 5,909,350, both of which are previously incorporated herein by reference.

Filter 2080 includes a plurality of apertures 2084 which receive contact pins (not shown) associated with male D-sub connectors commonly known in the art. One example of such a connector is a male D-sub RS-232 communications connector found in personal computers for coupling external devices such as modems to the computers. To be used in this embodiment of carrier 2070, filter 2080 must also be formed in the shape of a parallelogram or D-shape and have dimensions similar to those of carrier 2070. Filter 2080 includes plated surface 2082 along its periphery which is electrically connected to the common ground conductive plates of filter 2080. In use, conductor carrier 2070 receives multi-conductor filter 2080 which abuts against inner shelf 2076. Shelf 2076 is coated with a solder re-flow so that once filter 2080 is inserted into carrier 2070 and resting upon shelf 2076, standard re-flow methods can be used to solder filter 2080 within carrier 2070. Such standard re-flow methods include the use of infrared radiation (IR), vapor phase and hot air ovens. The subassembly of filter 2080 and carrier 2070 is then inserted within D-sub connector shell 2074 so the subassembly is contained within wall 2088 and abutted against shelf 2086 which serves as a stop for carrier 2070. Connector carrier 2070 is fabricated from a conductive material such as metal and, to obtain the full benefits of the present invention, D-sub connector shell 2074 will also be fabricated from a conductive metallic material. The plurality of protuberances 2072 provide a resistive fit for carrier 2070 against wall 2088 of D-sub connector shell 2074 which maintains carrier 2070 within shell 2074 and provides for electrical conduction between plated surface 2082 of filter 2080 and shell 2074. As in previous embodiments, electrically coupling the ground connection for multi-conductor filter 2080 to carrier 2070 and D-sub connector shell 2074 increases the surface area provided for absorbing and dissipating electromagnetic interference and over voltages.

Figure 17:
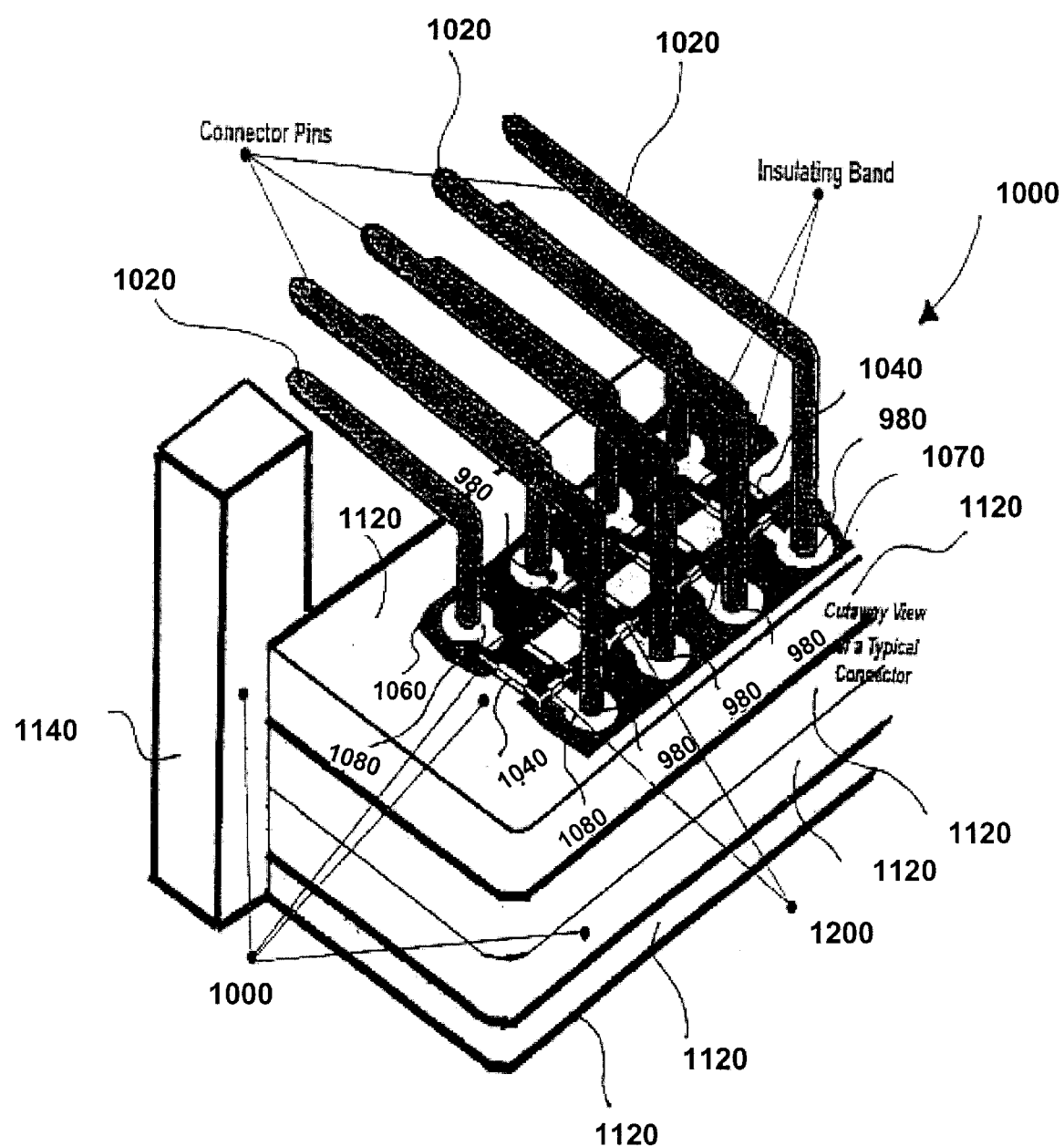
FIG. 17 is a partial perspective view of a further embodiment of a connector surface mount component carrier of the present invention.

An additional embodiment of the present invention, connector carrier 1000, is illustrated in FIG. 17. In this embodiment the surface mount component carrier is directly incorporated within an electronic connector. Connector carrier 1000 is comprised of a metalized plastic base 1120 having a plurality of apertures 980 disposed through base 1120, each of which receives a connector pin 1020. Although not shown, portions of each connector pin 1020 extends through base 1120 and out of the front 1100 of connector carrier 1000. The portions of pins 1020 extending from the front 1100 of carrier 1000 form a male connector which is then, in turn, received by a female connector as is known in the art. Coupled to both edges of connector carrier 1000, although only one edge is shown, is mounting base 1140 which elevates base 1120 from a surface such as a printed circuit board. The particular embodiment of connector 1000 shown in FIG. 17 is of a right angle connector in which the tips of pins 1020 would be inserted within apertures in a printed circuit board. Pins 1020 would then be soldered to the individual apertures or pads in the printed circuit board to provide electrical connection between pins 1020 and any circuitry on the printed circuit board. To provide for the coupling of a plurality of differential and common mode filters 1040 between the various connector pins 1020, two insulating bands 1060 and 1070 are provided to electrically isolate each of the connector pins 1020 from the metalized plastic base 1120 which covers substantially all of the surface area of connector carrier 1000.

Referring to FIG. 18, the relationship between insulating bands 1060 and 1070, metalized plastic base 1120 and differential and common mode filter 1040 will be explained in more detail. While only one example is shown, both insulating bands 1060 and 1070 include a plurality of conductive pads 1080 which surround apertures 980. Conductive pads 1080 are electrically coupled to connector pins 1020 disposed through apertures 980. Insulating bands 1060 and 1070 provide a non-conductive barrier between the conductive pads 1080 and the metalized plastic base 1120. Surface mount components, such as differential and common mode filter 1040, are positioned between insulated bands 1060 and 1070 so that first differential conductive band 1160 of filter 1040 comes in contact with a portion of a conductive pad 1080 and second differential conductive band 1180 comes in contact with a portion of an opposite conductive pad 1080. Insulated outer casing 1220 of filter 1040 slightly overlaps onto each insulating band 1060 and 1070 and metalized plastic base 1120 to maintain electrical isolation of first and second differential conductive bands 1160 and 1180 and metalized plastic base 1120 of connector carrier 1000. Because metalized plastic base 1120 runs between insulating bands 1060 and 1070, common ground conductive bands 1200 of filter 1040 come in contact with the metalized plastic base 1120. As described earlier, each of the various conductive bands of filter 1040 are comprised of solder terminations which, when subjected to known solder re-flow methods, physically and electrically couple to any metallic surfaces which they come in contact thereby permanently coupling the surface mount components, i.e. filter 1040, to connector carrier 1000. As in the previous embodiments, connector carrier 1000 allows miniature, fragile surface mount components to be used without subjecting those components to increased physical stress which can cause damage to the components, lowering production yields and increasing overall production costs. Metalized plastic base 1120 also provides a large conductive surface area connected to the ground terminations of filter 1040 improving the ground shield used to absorb and dissipate electromagnetic interference and over voltages.

As can be seen, many different applications of the differential and common mode filter architecture with a carrier are possible and review of several features universal to all the embodiments must be noted. First, the material having predetermined electrical properties may be one of a number in any of the embodiments including but not limited to dielectric material, metal oxide varistor material, ferrite material and other more exotic substances such as Mylar film or sintered polycrystalline. No matter which material is used, the combination of common ground conductive plates and electrode conductive plates creates a plurality of capacitors to form a line-to-line differential coupling capacitor between and two line-to-ground decoupling capacitors from a pair of electrical conductors. The material having electrical properties will vary the capacitance values and/or add additional features such as over-voltage and surge protection or increased inductance, resistance, or a combination of all the above.

In fact the differential and common mode filter, although not shown, could easily be fabricated in silicon and directly incorporated into integrated circuits for use in such applications as communication chips. The differential and common mode filter would be embedded and filter communication or data lines directly from their circuit board terminal connections, thus reducing circuit board real estate requirements and further reducing overall circuit size while having simpler production requirements. Integrated circuits are already being made having capacitors etched within the silicone foundation which allows the architecture of the present invention to readily be incorporated with technology available today.

Second, in all embodiments whether shown or not, the number of plates, both common conductive and electrode, can be multiplied to create a number of capacitive elements in parallel which thereby add to create increased capacitance values.

Third, additional common ground conductive plates surrounding the combination of a center conductive plate and a plurality of conductive electrodes may be employed to provide an increased inherent ground and surge dissipation area and a true Faraday shield in all embodiments. Additional common ground conductive plates can be employed with any of the embodiments shown and is fully contemplated by Applicant.

Finally, from a review of the numerous embodiments it should be apparent that the shape, thickness or size may be varied depending on the electrical characteristics desired or upon the application in which the filter is to be used due to the physical architecture derived from the arrangement of common ground conductive and conductive electrode plates.

Although the principles, preferred embodiments and preferred operation of the present invention have been described in detail herein, this is not to be construed as being limited to the particular illustrative forms disclosed. They will thus become apparent to those skilled in the art that various modifications of the preferred embodiments herein can be made without departing from the spirit or scope of the invention as defined by the appended claims.

What is claimed is:

1. A differential mode and common mode filter arrangement comprising:
    paired electrodes of substantially the same size and shape;
        the paired electrodes are oppositely positioned relative to each other;
    a material having at least predetermined properties;
    an internal conductive shielding means for attenuation of both internal and external radiated electromagnetic energy and that at least dissipates over voltages;
    an external conductive means for improving the performance of the internal conductive shielding means for attenuation;
    the paired electrodes are spaced apart by the material;
        the paired electrodes are conductively isolated from each other; and
    wherein the paired electrodes are conductively isolated from both the internal conductive shielding means for attenuation and the external conductive means for improving the performance of the internal conductive shielding means for attenuation.

2. The differential mode and common mode filter arrangement of claim 1, wherein the material having predetermined properties is a material having dielectric properties.

3. The differential mode and common mode filter arrangement of claim 1, wherein the material having predetermined properties is a material having ferrite properties.

4. The differential mode and common mode filter arrangement of claim 1, wherein the material having predetermined properties is a material having varistor properties.

5. The differential mode and common mode filter arrangement of claim 1 operable as a differential mode and common mode bypass filter arrangement.

6. The differential mode and common mode filter arrangement of claim 1 operable as a portion of a capacitive network.

7. A circuit comprising:
    at least the differential mode and common mode filter arrangement of claim 1.

8. A differential mode and common mode filter arrangement comprising:

an electrode arrangement having;
   a plurality of electrodes, and wherein the electrodes of the plurality of electrodes are arranged spaced-apart by a material having at least ferromagnetic properties;
   a first electrode of the plurality of electrodes positioned below a second electrode of the plurality of electrodes;
   a third electrode of the plurality of electrodes positioned above the second electrode;
   a fourth electrode of the plurality of electrodes positioned above the third electrode;
   a fifth electrode of the plurality of electrodes positioned above the fourth electrode;
   the second electrode and the fourth electrode are conductively isolated from each other;
   the first electrode, the third electrode and the fifth electrode are conductively coupled to one another;
   the first electrode, the third electrode and the fifth electrode are conductively isolated from the second electrode and the fourth electrode; and
at least a first energy pathway and a second energy pathway that are conductively isolated from each other;
a common energy pathway located amid the first energy pathway and the second energy pathway;
the second electrode is conductively coupled to the first energy pathway;
the fourth electrode is conductively coupled to the second energy pathway;
the first electrode, the third electrode and the fifth electrode are conductively coupled to the common energy pathway; and
wherein the common energy pathway is conductively isolated from the first energy pathway and the second energy pathway.

9. The differential mode and common mode filter arrangement of claim 8, wherein the third electrode is the central electrode of the plurality of electrodes.

10. The differential mode and common mode filter arrangement of claim 9, wherein the first electrode, the third electrode and the fifth electrode are substantially the same size; and
wherein the second electrode and the fourth electrode are substantially the same size.

11. The differential mode and common mode filter arrangement of claim 10, wherein the first electrode, the third electrode and the fifth electrode are substantially the same shape;
the second electrode and the fourth electrode are substantially the same shape; and
wherein the second electrode and the fourth electrode are shielded from each other.

12. The differential mode and common mode filter arrangement of claim 10 operable as a differential mode and common mode bypass filter arrangement.

13. The differential mode and common mode filter arrangement of claim 11, wherein the first electrode, the third electrode and the fifth electrode are operable as shielding electrodes of at least the second electrode and the fourth electrode.

14. The differential mode and common mode filter arrangement of claim 12, wherein the first electrode, the third electrode and the fifth electrode are operable as shielding electrodes of at least the second electrode and the fourth electrode.

15. The differential mode and common mode filter arrangement of claim 13 operable as a portion of a capacitive network.

16. A circuit comprising:
at least the differential mode and common mode filter arrangement of claim 15.

17. The differential mode and common mode filter arrangement of claim 11, wherein the first energy pathway and the second energy pathway are paired conductors;
the common energy pathway is a conductive area; and
wherein the conductive area is always conductively and electrically isolated from the paired conductors.

18. The differential mode and common mode filter arrangement of claim 8, wherein the differential mode and common mode filter arrangement is operable for simultaneous common mode and differential mode filtering with a surge protection function.

19. The differential mode and common mode filter arrangement of claim 13, wherein the material having ferromagnetic properties is a material having predominately varistor material properties.

20. The differential mode and common mode filter arrangement of claim 13, wherein the material having ferromagnetic properties is a material having predominately dielectric material properties.

21. The differential mode and common mode filter arrangement of claim 17, wherein the material having ferromagnetic properties is a material having predominately varistor material properties.

22. The differential mode and common mode filter arrangement of claim 17, wherein the material having ferromagnetic properties is a material having predominately dielectric material properties.

23. A differential mode and common mode filter arrangement comprising:
a plurality of common electrodes arranged conductively coupled to one another, and wherein each common electrode of the plurality of common electrodes is substantially the same size;
paired electrodes arranged conductively isolated from each other, and wherein each electrode of the paired electrodes is substantially the same size;
a material having predetermined properties;
paired conductors that are conductively isolated from each other;
a conductive area;
a first common electrode of the plurality of common electrodes is supported by a first portion of the material having predetermined properties;
a first electrode of the paired electrodes is supported by a second portion of the material having predetermined properties;
the first common electrode and the first portion of the material having predetermined properties are positioned below the first electrode and the second portion of the material having predetermined properties;
a second common electrode of the plurality of common electrodes supported by a third portion of the material having predetermined properties is positioned above the first electrode;
a second electrode of the paired electrodes supported by a fourth portion of the material having predetermined properties is positioned above the second common electrode;
a third common electrode of the plurality of common electrodes supported by a fifth portion of the material having predetermined properties is positioned above the second electrode;

a first conductor of the paired conductors is conductively coupled to the first electrode;

a second conductor of the paired conductors is conductively coupled to the second electrode;

the plurality of common electrodes is conductively coupled to the conductive area;

the plurality of common electrodes and the conductive area are both conductively isolated from the paired electrodes and the paired conductors; and wherein the second common electrode is the central electrode of the differential mode and common mode filter arrangement.

24. A circuit comprising:

at least the differential mode and common mode filter arrangement of claim 23.

25. The differential mode and common mode filter arrangement of claim 23, wherein the material having predetermined properties; and wherein the material having predetermined properties is a material having either predominately dielectric properties, or predominately ferrite properties, or predominately varistor properties.

26. The differential mode and common mode filter arrangement of claim 25 operable as a differential mode and common mode bypass filter arrangement.

27. The differential mode and common mode filter arrangement of claim 25 operable as a portion of a capacitive network.

28. A differential mode and common mode filter arrangement comprising:

paired electrodes of substantially the same size and shape;

the electrodes of the paired electrodes are spaced apart from each other;

the electrodes of the paired electrodes are oppositely positioned relative to each;

the electrodes of the paired electrodes are conductively isolated from each other;

a common conductive means for shielding paired electrodes from each other; the paired electrodes are spaced apart from the common conductive means for shielding paired electrodes from each other;

a means for electrode support operable for both the common conductive means for shielding paired electrodes from each other and the paired electrodes;

at least a first energy pathway and a second energy pathway that are conductively isolated from each other;

a common energy pathway located amid the first energy pathway and the second energy pathway;

a first electrode of the paired electrodes is conductively coupled to the first energy pathway;

a second electrode of the paired electrodes is conductively coupled to the second energy pathway;

the common conductive means for shielding paired electrodes from each other is conductively coupled to the common energy pathway; and wherein the common energy pathway is conductively isolated from the first energy pathway and the second energy pathway.

29. The differential mode and common mode filter arrangement of claim 28, wherein the means for electrode support is a material having predetermined properties; and wherein the material having predetermined properties is a material having either predominately dielectric properties, or predominately ferrite properties, or predominately varistor properties.

30. The differential mode and common mode filter arrangement of claim 29 operable as a differential mode and common mode bypass filter arrangement.

31. The differential mode and common mode filter arrangement of claim 29 operable as a portion of a capacitive network.

32. A circuit comprising:

at least the differential mode and common mode filter arrangement of claim 29.

33. The circuit of claim 7, comprising:

a capacitive network having at least a capacitor created between the paired differential electrodes;

the capacitive network having at least a capacitor created from a first differential electrode of the paired differential electrodes to the external conductive means for improving the performance of the internal conductive shielding means for attenuation; and wherein the capacitive network has at least a capacitor created from a second differential electrode of the paired differential electrodes to the external conductive means for improving the performance of the internal conductive shielding means for attenuation.

34. The circuit of claim 16, comprising:

a capacitive network having at least a capacitor created between the paired electrodes;

the capacitive network having at least a capacitor created from a first electrode of the paired electrodes to the conductive area; and wherein the capacitive network has at least a capacitor created from a second electrode of the paired electrodes to the conductive area.

35. The circuit of claim 24, comprising:

a capacitive network having at least a capacitor created between the paired electrodes;

the capacitive network having at least a capacitor created from the first electrode to the conductive area; and wherein the capacitive network has at least a capacitor created from the second electrode to the conductive area.

36. The circuit of claim 32, comprising:

a capacitive network having at least a capacitor created between the first energy pathway and the second energy pathway;

the capacitive network having at least a capacitor created from the first energy pathway to the common energy pathway; and wherein the capacitive network has at least a capacitor created from the second energy pathway to the common energy pathway.

* * * * *

UNITED STATES PATENT AND TRADEMARK OFFICE
CERTIFICATE OF CORRECTION

PATENT NO. : 6,650,525 B2
DATED : November 18, 2003
INVENTOR(S) : Anthony A. Anthony It is certified that error appears in the above-identified patent and that said Letters Patent is hereby corrected as shown below:

Title page,
Item [63], Related U.S. Application Data, "Continuation of application No. 09/697,484, filed on Oct. 26, 2000, now abandoned, which is a continuation of application No. 09/056,436, filed on Apr. 7, 1998, now abandoned, and a continuation of application No. 09/056,379, filed on Apr. 7, 1998, now Pat. No. 6,018,448, which is a continuation-in-part of application No. 09/008,769, filed on Jan. 19, 1998, now Pat. No. 6,097,581, which is a continuation-in-part of application No. 08/841,940, filed on Apr. 8, 1997, now Pat. No. 5,909,350." should read -- Continuation of application No. 09/697,484, filed on Oct. 26, 2000, now abandoned, which is a continuation of application No. 09/056,436, filed on Apr. 7, 1998, now abandoned, which is a continuation-in-part of application No. 09/008,769, filed on Jan. 19 ,1998, now Pat. No. 6,097,581, which is a continuation-in-part of application No. 08/841,940, filed on Apr. 8, 1997, now Pat. No. 5,909,350. --

Column 1,
Lines 3-11, "This application is a continuation of application Ser. No. 09/697,484 filed Oct. 26, 2000 now abandonded, which is a continuation of both application Ser. No. 09/056,436 filed Apr. 7, 1998, now abandoned, and application Ser. No. 09/056,379 filed Apr. 7, 1998, now U.S. Pat. No. 6,018,448, which is a continuation-in-part of application Ser. No. 09/008,769 filed Jan. 19, 1998, now U.S. Pat. No. 6,097,581, which is a continuation-in-part of application Ser. No. 08/841,940 filed Apr. 8, 1997, now U.S. Pat. No. 5,909,350." should read -- This application is a continuation of application Ser. No. 09/697,484 filed Oct. 26, 2000 now abandoned, which is a continuation of 09/056,436 filed Apr. 7, 1998, now abandoned, which is a continuation-in-part of application Ser. No. 09/008,769 filed Jan. 19, 1998, now U.S. Patent 6,097,581, which is a continuation-in-part of U.S. Application 08/841,940, filed Apr. 8, 1997, now U.S. Pat. No. 5,909,350. --

Signed and Sealed this

Ninth Day of November, 2004

JON W. DUDAS
*Director of the United States Patent and Trademark Office*

UNITED STATES PATENT AND TRADEMARK OFFICE
Certificate

Patent No. 6,650,525 B2                                             Patented: November 18, 2003

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Anthony A. Anthony, Erie, PA (US); and William M. Anthony, Erie, PA (US).

Signed and Sealed this Twenty-fourth Day of April 2012.

*JARED FUREMAN*
*Supervisory Patent Examiner*
*Art Unit 2836*
*Technology Center 2800*